United States Patent
Horstman et al.

(10) Patent No.: US 9,051,436 B2
(45) Date of Patent: Jun. 9, 2015

(54) COMPOSITIONS OF RESIN-LINEAR ORGANOSILOXANE BLOCK COPOLYMERS

(71) Applicant: Dow Corning Corporation, Midland, MI (US)

(72) Inventors: John Bernard Horstman, Midland, MI (US); Steven Swier, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 14/386,171

(22) PCT Filed: Mar. 14, 2013

(86) PCT No.: PCT/US2013/031308
§ 371 (c)(1),
(2) Date: Sep. 18, 2014

(87) PCT Pub. No.: WO2013/142252
PCT Pub. Date: Sep. 26, 2013

(65) Prior Publication Data
US 2015/0045520 A1    Feb. 12, 2015

Related U.S. Application Data

(60) Provisional application No. 61/613,531, filed on Mar. 21, 2012.

(51) Int. Cl.
C08G 77/44 (2006.01)
C08G 77/48 (2006.01)
H01L 33/00 (2010.01)
H01L 33/56 (2010.01)

(52) U.S. Cl.
CPC ............... *C08G 77/44* (2013.01); *H01L 33/56* (2013.01)

(58) Field of Classification Search
None
See application file for complete search history.

(56) References Cited

U.S. PATENT DOCUMENTS

| | | | | | |
|---|---|---|---|---|---|
| 3,328,481 | A | * | 6/1967 | Vincent | 525/477 |
| 3,576,905 | A | * | 4/1971 | Hartlein | 528/34 |
| 3,619,229 | A | * | 11/1971 | Hartlein | 523/209 |
| 3,629,228 | A | * | 12/1971 | Hartlein | 528/17 |
| 3,636,134 | A | | 1/1972 | Antonen | |
| 3,639,155 | A | | 2/1972 | Hartlein et al. | |
| 3,647,846 | A | * | 3/1972 | Hartlein | 556/436 |
| 3,670,649 | A | * | 6/1972 | Hartlein et al. | 102/431 |
| 4,013,611 | A | * | 3/1977 | Hechtl et al. | 523/212 |
| 4,419,402 | A | * | 12/1983 | Gutek | 442/145 |
| 4,443,502 | A | * | 4/1984 | Gutek | 427/387 |
| 7,312,008 | B2 | * | 12/2007 | Wu et al. | 430/66 |
| 2005/0180712 | A1 | * | 8/2005 | Shelnut et al. | 385/129 |
| 2006/0035092 | A1 | * | 2/2006 | Shimizu et al. | 428/447 |
| 2007/0196309 | A1 | * | 8/2007 | Tarletsky et al. | 424/70.12 |
| 2009/0297461 | A1 | * | 12/2009 | Perle et al. | 424/59 |
| 2010/0081748 | A1 | * | 4/2010 | Taguchi et al. | 524/433 |
| 2010/0273927 | A1 | * | 10/2010 | Taguchi et al. | 524/433 |

FOREIGN PATENT DOCUMENTS

WO    WO-2012/040302 A1    3/2012
WO    WO-2013/142252 A1    9/2013

OTHER PUBLICATIONS

"International Application Serial No. PCT/US2013/031308, International Search Report mailed Aug. 9, 2013", 3 pgs.
"International Application Serial No. PCT/US2013/031308, Written Opinion mailed Aug. 9, 2013", 6 pgs.

* cited by examiner

*Primary Examiner* — Robert S Loewe
(74) *Attorney, Agent, or Firm* — Schwegman Lundberg & Woessner, P.A.

(57) ABSTRACT

Hot melt adhesive compositions are disclosed containing the reaction product of a resin linear organosiloxane block copolymer and an organosilane capping agent containing hydrolyzable groups.

20 Claims, No Drawings

COMPOSITIONS OF RESIN-LINEAR ORGANOSILOXANE BLOCK COPOLYMERS

CROSS-REFERENCE TO RELATED APPLICATIONS

This application is a U.S. national stage application filed under 35 U.S.C. 371 from International Application Serial No. PCT/US2013/031308, which was filed Mar. 14, 2013, and published as WO 2013/142252 on Sep. 26, 2013, and which claims the benefit of U.S. Provisional Patent Appl. Ser. No. 61/613,531, filed Mar. 21, 2012, which applications and publication are incorporated by reference as if reproduced herein and made a part hereof in their entirety, and the benefit of priority of each of which is claimed herein.

BACKGROUND

Hot melt compositions are, in some cases, thermoplastic adhesives that can be dispensed when hot (e.g., at temperatures ranging from 80° C. to 200° C.) and acquire "green strength" (i.e., the ability of an adhesive to be handled before it has completely cured) from cooling below the transition temperature. This allows for efficient bonding operations in original equipment manufacturer (OEM) assembly applications, by decreasing cycle time. Also, hot melts use less energy per unit of production than solvent or water-based sealing systems; are more environmentally friendly; and do not require mixing of two parts. There is therefore a need to identify moisture curable hot melt compositions (e.g., hot melt adhesive compositions), including those having improved physical properties, such as improved mechanical toughness and optical clarity.

BRIEF SUMMARY OF THE EMBODIMENTS

Embodiment 1 relates to a hot melt composition comprising the reaction product of:
A) a resin linear organosiloxane block copolymer comprising: 40 to 90 mole percent disiloxy units of the formula $[R^1_2SiO_{2/2}]$, 10 to 60 mole percent trisiloxy units of the formula $[R^2SiO_{3/2}]$, 0.5 to 35 mole percent silanol groups [≡SiOH];
wherein:
each $R^1$, at each occurrence, is independently a $C_1$ to $C_{30}$ hydrocarbyl,
each $R^2$, at each occurrence, is independently a $C_1$ to $C_{20}$ hydrocarbyl;
wherein:
the disiloxy units $[R^1_2SiO_{2/2}]$ are arranged in linear blocks having an average of from 10 to 400 disiloxy units $[R^1_2SiO_{2/2}]$ per linear block, the trisiloxy units $[R^2SiO_{3/2}]$ are arranged in non-linear blocks having a molecular weight of at least 500 g/mole, at least 30% of the non-linear blocks are crosslinked with each other,
each linear block is linked to at least one non-linear block; and
the organosiloxane block copolymer has a weight average molecular weight of at least 20,000 g/mole; and
B) a capping agent of the formula $R^5SiX_3$
wherein $R^5$ is a $C_1$ to $C_{12}$ hydrocarbyl, an organohydrogensiloxane, or a vinyl functional organosiloxane;
X is a hydrolyzable group chosen from —$OR^6$, —Cl, —OC(O)$R^6$, —N($R^6$)$_2$, or —ON=C$R^6_2$, wherein $R^6$ is hydrogen or a $C_1$ to $C_6$ alkyl group.

Embodiment 2 relates to the hot melt composition of Embodiment 1, wherein the hot melt composition is a hot melt adhesive composition.

Embodiment 3 relates to the hot melt composition of Embodiment 1, further comprising C) a cure catalyst.

Embodiment 4 relates to the hot melt composition Embodiments 1-2, wherein the resin linear organopolysiloxane is prepared by:
I) reacting
a) a linear organosiloxane having the formula

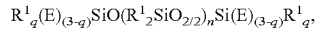

wherein each $R^1$, at each occurrence, is independently a $C_1$ to $C_{30}$ hydrocarbyl,
n is 10 to 400,
q is 0, 1 or 2,
E is a hydrolyzable group containing at least one carbon atom, and
b) an organosiloxane resin comprising at least 60 mole % of $[R^2SiO_{3/2}]$ siloxy units in its formula, wherein each $R^2$, at each occurrence, is independently a $C_1$ to $C_{20}$ hydrocarbyl,
in c) an organic solvent;
to form a resin-linear organosiloxane block copolymer;
wherein the amounts of a) and b) used in step I are selected to provide the resin-linear organosiloxane block copolymer with 40 to 90 mole % of disiloxy units $[R^1_2SiO_{2/2}]$ and 10 to 60 mole % of trisiloxy units $[R^2SiO_{3/2}]$, and
wherein at least 95 weight percent of the linear organosiloxane used in step I is incorporated into the resin-linear organosiloxane block copolymer; and
II) reacting the resin-linear organosiloxane block copolymer from step i) and organosilane having the formula $R^6_qSiX_{4-q}$, wherein $R^6$ is a $C_1$ to $C_8$ hydrocarbyl or a $C_1$ to $C_8$ halogen-substituted hydrocarbyl, X is a hydrolysable group, and q is 0, 1, or 2;
to crosslink the trisiloxy units of the resin-linear organosiloxane block copolymer sufficiently to increase the weight average molecular weight ($M_w$) of the resin-linear organosiloxane block copolymer by at least 50%.

Embodiment 5 relates to the hot melt composition of Embodiment 4, wherein E is acetoxy and q is 1.

Embodiment 6, relates to the hot melt composition of Embodiment 4, wherein the organosilane is an alkyltriacetoxysilane.

Embodiment 7 relates to the hot melt composition of Embodiments 4-6, wherein wherein the capping agent is an alkyltriacetoxysilane.

Embodiment 8 relates to the hot melt composition of Embodiments 4-6, wherein the capping agent is an alkyltrialkoxysilane.

Embodiment 9 relates to the hot melt composition of Embodiments 1-3, wherein the resin linear organopolysiloxane is prepared by:
I) reacting
a) a linear organosiloxane having the formula

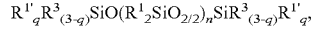

wherein:
each $R^{1'}$, at each occurrence, is independently a $C_1$ to $C_{30}$ hydrocarbyl free of aliphatic unsaturation,
each $R^3$, at each occurrence, is independently H, $R^{1'}$, or $R^4$, wherein each $R^4$, at each occurrence, is independently a $C_2$ to $C_{12}$ hydrocarbyl group having at least one aliphatic unsaturated bond, and
n is 10 to 400, q is 0, 1, or 2;

b) an organosiloxane resin having the average formula:

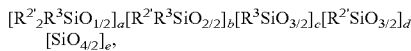

wherein:
each $R^{2'}$, at each occurrence, is independently a $C_1$ to $C_{20}$ hydrocarbyl free of aliphatic unsaturation,
each $R^3$, at each occurrence, is independently H, $R^{1'}$ or $R^4$,
wherein each $R^4$, at each occurrence, is a $C_2$ to $C_{12}$ hydrocarbyl group having at least one aliphatic unsaturated bond,
the subscripts a, b, c, d, and e represent the mole fraction of each siloxy unit present in the organosiloxane resin and range as follows:
a is about 0 to about 0.7,
b is about 0 to about 0.3,
c is about 0 to about 0.8,
d is about 0 to about 0.9,
e is about 0 to about 0.7,
with the provisos that a+b+c>0, c+d+e≥0.6, and a+b+c+d+e≈1,
with the proviso that at least one $R^3$ substituent is H on either of the linear organosiloxane or organosiloxane resin, and at least one $R^3$ substituent is $R^4$ on the other organosiloxane; and
c) a hydrosilylation catalyst;
in an organic solvent;
to form a resin-linear organosiloxane block copolymer;
wherein the amounts of a) and b) used in step I are selected to provide the resin-linear organosiloxane block copolymer with 40 to 90 mole % of disiloxy units $[R^{1'}_2SiO_{2/2}]$ and 10 to 60 mole % of $[R^{2'}SiO_{3/2}]$ and/or $[SiO_{4/2}]$ siloxy units, and
wherein at least 95 weight percent of the linear organosiloxane added in step I is incorporated into the resin-linear organosiloxane block copolymer;
II) reacting the resin-linear organosiloxane block copolymer from step I) to crosslink the $[R^{2'}SiO_{3/2}]$ and/or $[SiO_{4/2}]$ siloxy units of the resin-linear organosiloxane block copolymer sufficiently to increase the weight average molecular weight ($M_w$) of the resin-linear organosiloxane block copolymer by at least 50%.

Embodiment 10 relates to the process of Embodiment 9, wherein component a) has the average formula:

$$H(CH_3)_2SiO[(CH_3)_2SiO_{2/2})]_nSi(CH_3)_2H$$

where n may vary from 10 to 400,
and component b) has the average formula $$[(H_2C=CH)(CH_3)_2SiO_{1/2}]_a[(C_6H_5)SiO_{3/2}]_d[SiO_{4/2}]_e$$

where the subscripts a, d, and e are as defined in Embodiment 1.

Embodiment 11 relates to the process of Embodiment 9, wherein component a) has the average formula $$(H_2C=CH)(CH_3)_2SiO[(CH_3)_2SiO_{2/2})]_nSi(CH_3)_2(HC=CH_2)$$

where n may vary from 10 to 400,
and component b) has the average formula $$[H(CH_3)_2SiO_{1/2}]_a[SiO_{4/2}]_e$$

where the subscripts a and e are as defined in Embodiment 1.

Embodiment 12 relates to the hot melt composition of Embodiments 9-11, wherein the capping agent has the formula:

$$H(CH_3)_2SiOSi(CH_3)_2CH_2CH_2Si(OCH_3)_3$$

Embodiment 13 relates to the hot melt composition of Embodiments 1-12, further comprising a cure catalyst, wherein the cure catalyst is selected from a titanate.

Embodiment 14 relates to the hot melt composition of Embodiment 13, wherein the titanate is tetra-n-butyl titanate.

Embodiment 15 relates to the hot melt composition of Embodiments 9-11, wherein a crosslinker is added in step II) and/or in step I), wherein the crosslinker has the formula:

$$R^{1'}_qR^3_{(3-q)}SiO(R^{1'}_2SiO_{2/2})_mSiR^3_{(3-q)}R^{1'}_q$$

wherein each $R^{1'}$, at each occurrence, is independently a $C_1$ to $C_{30}$ hydrocarbyl;
m varies from 0 to 50, q is 0, 1, or 2;
each $R^3$, at each occurrence, is independently H, $R^{1'}$, or $R^4$, wherein
each $R^4$, at each occurrence, is a $C_2$ to $C_{12}$ hydrocarbyl having at least one aliphatic unsaturated bond.

Embodiment 16 relates to the hot melt composition of Embodiment 15, wherein the crosslinker is tetramethyldisiloxane or divinyltetramethyldisiloxane.

Embodiment 17 relates to the hot melt composition of Embodiments 9-11, wherein step II) further comprises adding an organosilane having the formula $R^5_qSiX_{4-q}$, where $R^5$ is a $C_1$ to $C_8$ hydrocarbyl or a $C_1$ to $C_8$ halogen-substituted hydrocarbyl, X is a hydrolyzable group, and q is 0, 1, or 2.

Embodiment 18 relates to the hot melt composition of Embodiment 17, wherein the organosilane is an alkyltriacetoxysilane.

Embodiment 19 relates to the hot melt composition of Embodiment 18, wherein the alkyltriacetoxysilane is a mixture of two alkyltriacetoxysilanes.

Embodiment 20 relates to the hot melt composition of Embodiment 19, wherein the mixture of two alkyltriacetoxysilanes comprise, methyltriacetoxysilane and/or ethyltriacetoxysilane.

Embodiment 21 relates to the hot melt composition of Embodiments 9-11, wherein the organosiloxane resin is chosen from:

$[H(CH_3)_2SiO_{1/2}]_a[(C_6H_5)SiO_{3/2}]_d;$ $[H(CH_3)_2SiO_{1/2}]_a[(CH_3)_2SiO_{2/2}]_b[(C_6H_5)SiO_{3/2}]_d;$ $[H(CH_3)_2SiO_{1/2}]_a[(C_6H_5)_2SiO_{2/2}]_b[(C_6H_5)SiO_{3/2}]_d;$ $[H(CH_3)_2SiO_{1/2}]_a[(C_6H_5)(CH_3)SiO_{2/2}]_b[(C_6H_5)SiO_{3/2}]_d;$ $[H(CH_3)_2SiO_{1/2}]_a[(C_6H_5)SiO_{3/2}]_d[SiO_{4/2}]_e;$ $[H(CH_3)_2SiO_{1/2}]_a[(CH_3)_2SiO_{2/2}]_b[SiO_{4/2}]_e;$ $[H(CH_3)_2SiO_{1/2}]_a[SiO_{4/2}]_e;$ and combinations thereof.

Embodiment 22 relates to the hot melt composition of Embodiments 9-11, wherein the organosiloxane resin is chosen from:

$[Vi(CH_3)_2SiO_{1/2}]_a[(C_6H_5)SiO_{3/2}]_d;$ $[Vi(CH_3)_2SiO_{1/2}]_a[(CH_3)_2SiO_{2/2}]_b[(C_6H_5)SiO_{3/2}]_d;$ $[Vi(CH_3)_2SiO_{1/2}]_a[(C_6H_5)_2SiO_{2/2}]_b[(C_6H_5)SiO_{3/2}]_d;$ $[Vi(CH_3)_2SiO_{1/2}]_a[(C_6H_5)(CH_3)SiO_{2/2}]_b[(C_6H_5)SiO_{3/2}]_d;$ $[Vi(CH_3)_2SiO_{1/2}]_a[(C_6H_5)SiO_{3/2}]_d[SiO_{4/2}]_e;$ $[Vi(CH_3)_2SiO_{1/2}]_a[(CH_3)_2SiO_{2/2}]_b[SiO_{4/2}]_e;$ $[Vi(CH_3)_2SiO_{1/2}]_a[SiO_{4/2}]_e;$ and combinations thereof.

Embodiment 23 relates to the hot melt composition of Embodiments 1-22, which is curable.

Embodiment 24 relates to the hot melt composition of Embodiments 1-23, which is solid.

Embodiment 25 relates to the cured product of the composition of Embodiments 23-24.

Embodiment 26 relates to the cured product of the composition of Embodiments 23-24, which is produced by exposing the compositions to moisture.

Embodiment 27 relates to the cured product of the composition of Embodiment 26, wherein the moisture is ambient moisture.

Embodiment 28 relates to the solid film compositions of Embodiment 24, wherein the solid composition has an optical transmittance of at least 95%.

Embodiment 29 relates to an LED encapsulant comprising an organosiloxane block copolymer of Embodiments 1-28.

DETAILED DESCRIPTION OF THE EMBODIMENTS

The disclosure relates to moisture curable hot melt adhesives containing certain resin-linear organosiloxane block copolymers. In some embodiments, the disclosure relates to hot melt compositions (e.g., hot melt adhesive compositions) based on "resin-linear" organosiloxane block copolymers, such as those disclosed in Published PCT Appl. Nos. WO 2012/040302 and WO 2012/040302. In some embodiments, the glass transition of the resin "hard" segments in these organosiloxane block copolymer compositions may be used to control hot melt flow, while the mechanical properties can be independently controlled by the "soft" linear segment length and loading. The present compositions offer a greater degree of freedom for formulating silicone based hot melt adhesives as compared to conventional silicone hot melts. For example, hot melt compositions based on the present resin linear organosiloxane block copolymers may range from plastic optically clear materials using short linear segments to elastomeric optically clear materials for long linear segments.

Thus, in some embodiments, the disclosure relates to hot melt compositions (e.g., hot melt adhesive compositions) containing the reaction product of a resin linear organosiloxane block copolymer and an organosilane "capping agent" containing hydrolyzable groups.

The hot melt compositions (e.g., hot melt adhesive compositions) of the embodiments described herein comprise the reaction product of:

A) a resin linear organosiloxane block copolymer comprising:
   40 to 90 mole percent disiloxy units of the formula $[R^1_2SiO_{2/2}]$,
   10 to 60 mole percent trisiloxy units of the formula $[R^2SiO_{3/2}]$,
   0.5 to 35 mole percent silanol groups [≡SiOH];
   wherein:
     each $R^1$, at each occurrence, is independently a $C_1$ to $C_{30}$ hydrocarbyl,
     each $R^2$, at each occurrence, is independently a $C_1$ to $C_{20}$ hydrocarbyl;
   wherein:
     the disiloxy units $[R^1_2SiO_{2/2}]$ are arranged in linear blocks having an average of from 10 to 400 disiloxy units $[R^1_2SiO_{2/2}]$ per linear block, the trisiloxy units $[R^2SiO_{3/2}]$ are arranged in non-linear blocks having a molecular weight of at least 500 g/mole, at least 30% of the non-linear blocks are crosslinked with each other,
     each linear block is linked to at least one non-linear block; and the organosiloxane block copolymer has a weight average molecular weight of at least 20,000 g/mole; and B) a capping agent of the formula $R^5SiX_3$
   wherein $R^5$ is a $C_1$ to $C_{12}$ hydrocarbyl, an organohydrogensiloxane, or a vinyl functional organosiloxane;
   X is a hydrolyzable group chosen from —$OR^6$, Cl, —OC(O)$R^6$, —N($R^6$)$_2$, or —ON=C$R^6_2$, wherein $R^6$ is hydrogen or a $C_1$ to $C_6$ alkyl group.

Component A) in the present disclosure is a resin-linear organosiloxane block copolymer composition. The resin-linear organosiloxane block copolymer compositions useful as component A) may be selected from those described in Published PCT Appl. Nos. WO 2012/040302, WO2012/040305, WO2012/040367, WO2012/040453, and WO2012/040457, each of which is incorporated herein by reference in its entirety.

The organopolysiloxanes of the embodiments described herein as "resin-linear" organosiloxane block copolymers. Organopolysiloxanes are polymers containing siloxy units independently selected from ($R_3SiO_{1/2}$), ($R_2SiO_{2/2}$), (RSiO$_{3/2}$), or (SiO$_{4/2}$) siloxy units, where R may be, e.g., an organic group. These siloxy units are commonly referred to as M, D, T, and Q units respectively. These siloxy units can be combined in various manners to form cyclic, linear, or branched structures. The chemical and physical properties of the resulting polymeric structures vary depending on the number and type of siloxy units in the organopolysiloxane. For example, "linear" organopolysiloxanes may contain mostly D, or ($R_2SiO_{2/2}$) siloxy units, which results in polydiorganosiloxanes that are fluids of varying viscosities, depending on the "degree of polymerization" or "dp" as indicated by the number of D units in the polydiorganosiloxane. "Linear" organopolysiloxanes may have glass transition temperatures ($T_g$) that are lower than 25° C. "Resin" organopolysiloxanes result when a majority of the siloxy units are selected from T or Q siloxy units. When T siloxy units are predominately used to prepare an organopolysiloxane, the resulting organosiloxane is often referred to as a "resin" or a "silsesquioxane resin." Increasing the amount of T or Q siloxy units in an organopolysiloxane may result in polymers having increasing hardness and/or glass like properties. "Resin" organopolysiloxanes thus have higher $T_g$ values, for example siloxane resins often have $T_g$ values greater than 40° C., e.g., greater than 50° C., greater than 60° C., greater than 70° C., greater than 80° C., greater than 90° C. or greater than 100° C. In some embodiments, $T_g$ for siloxane resins is from about 60° C. to about 100° C., e.g., from about 60° C. to about 80° C., from about 50° C. to about 100° C., from about 50° C. to about 80° C. or from about 70° C. to about 100° C.

As used herein "organosiloxane block copolymers" or "resin-linear organosiloxane block copolymers" refer to organopolysiloxanes containing "linear" D siloxy units in combination with "resin" T siloxy units. In some embodiments, the organosiloxane copolymers are "block" copolymers, as opposed to "random" copolymers. As such, the "resin-linear organosiloxane block copolymers" of the disclosed embodiments refer to organopolysiloxanes containing D and T siloxy units, where the D units (i.e., $[R^1_2SiO_{2/2}]$ units) are primarily bonded together to form polymeric chains having, in some embodiments, an average of from 10 to 400 D units (e.g., an average of from about 10 to about 400 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), which are referred herein as "linear blocks."

The T units (i.e., $[R^2SiO_{3/2}]$) are, in some embodiments, primarily bonded to each other to form branched polymeric chains, which are referred to as "non-linear blocks." In some embodiments, a significant number of these non-linear blocks may further aggregate to form "nano-domains" when solid forms of the block copolymer are provided. In some embodiments, these nano-domains form a phase separate from a phase formed from linear blocks having D units, such that a resin-rich phase forms.

In some embodiments, the non-linear blocks have a number average molecular weight of at least 500 g/mole, e.g., at least 1000 g/mole, at least 2000 g/mole, at least 3000 g/mole or at least 4000 g/mole; or have a molecular weight of from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to 2000 g/mole, from about 1000 g/mole to about 1500 g/mole, from about 1000 g/mole to about 1200 g/mole, from about 1000 g/mole to about 3000 g/mole, from about 1000 g/mole to about 2500 g/mole, from about 1000 g/mole to about 4000 g/mole, from about 2000 g/mole to about 3000 g/mole or from about 2000 g/mole to about 4000 g/mole.

The organosiloxane block copolymers (e.g., those comprising 40 to 60 mole percent disiloxy units of the formula $[R^1_2SiO_{2/2}]$ and 10 to 60 mole percent trisiloxy units of the formula $[R^2SiO_{3/2}]$) may be represented by the formula $[R^1_2SiO_{2/2}]_a[R^2SiO_{3/2}]_b$ where the subscripts a and b represent the mole fractions of the siloxy units in the copolymer, a is about 0.4 to about 0.9,
   alternatively about 0.5 to about 0.9,
      alternatively about 0.6 to about 0.9,
b is about 0.1 to about 0.6,
   alternatively about 0.1 to about 0.5,
   alternatively about 0.1 to about 0.4,
wherein each $R^1$, at each occurrence, is independently a $C_1$ to $C_{30}$ hydrocarbyl, and
each $R^2$, at each occurrence, is independently a $C_1$ to $C_{20}$ hydrocarbyl.

In some embodiments, the organosiloxane block copolymers of the embodiments described herein comprise 40 to 90 mole percent disiloxy units of the formula $[R^1_2SiO_{2/2}]$, e.g., 50 to 90 mole percent disiloxy units of the formula $[R^1_2SiO_{2/2}]$; 60 to 90 mole percent disiloxy units of the formula $[R^1_2SiO_{2/2}]$; 65 to 90 mole percent disiloxy units of the formula $[R^1_2SiO_{2/2}]$; 70 to 90 mole percent disiloxy units of the formula $[R^1_2SiO_{2/2}]$; or 80 to 90 mole percent disiloxy units of the formula $[R^1_2SiO_{2/2}]$; 40 to 80 mole percent disiloxy units of the formula $[R^1_2SiO_{2/2}]$; 40 to 70 mole percent disiloxy units of the formula $[R^1_2SiO_{2/2}]$; 40 to 60 mole percent disiloxy units of the formula $[R^1_2SiO_{2/2}]$; 40 to 50 mole percent disiloxy units of the formula $[R^1_2SiO_{2/2}]$; 50 to 80 mole percent disiloxy units of the formula $[R^1_2SiO_{2/2}]$; 50 to 70 mole percent disiloxy units of the formula $[R^1_2SiO_{2/2}]$; 50 to 60 mole percent disiloxy units of the formula $[R^1_2SiO_{2/2}]$; 60 to 80 mole percent disiloxy units of the formula $[R^1_2SiO_{2/2}]$; 60 to 70 mole percent disiloxy units of the formula $[R^1_2SiO_{2/2}]$; or 70 to 80 mole percent disiloxy units of the formula $[R^1_2SiO_{2/2}]$.

In some embodiments, the organosiloxane block copolymers of the embodiments described herein comprise 10 to 60 mole percent trisiloxy units of the formula $[R^2SiO_{3/2}]$, e.g., 10 to 20 mole percent trisiloxy units of the formula $[R^2SiO_{3/2}]$; 10 to 30 mole percent trisiloxy units of the formula $[R^2SiO_{3/2}]$; 10 to 35 mole percent trisiloxy units of the formula $[R^2SiO_{3/2}]$; 10 to 40 mole percent trisiloxy units of the formula $[R^2SiO_{3/2}]$; 10 to 50 mole percent trisiloxy units of the formula $[R^2SiO_{3/2}]$; 20 to 30 mole percent trisiloxy units of the formula $[R^2SiO_{3/2}]$; 20 to 35 mole percent trisiloxy units of the formula $[R^2SiO_{3/2}]$; 20 to 40 mole percent trisiloxy units of the formula $[R^2SiO_{3/2}]$; 20 to 50 mole percent trisiloxy units of the formula $[R^2SiO_{3/2}]$; 20 to 60 mole percent trisiloxy units of the formula $[R^2SiO_{3/2}]$; 30 to 40 mole percent trisiloxy units of the formula $[R^2SiO_{3/2}]$; 30 to 50 mole percent trisiloxy units of the formula $[R^2SiO_{3/2}]$; 30 to 60 mole percent trisiloxy units of the formula $[R^2SiO_{3/2}]$; 40 to 50 mole percent trisiloxy units of the formula $[R^2SiO_{3/2}]$; or 40 to 60 mole percent trisiloxy units of the formula $[R^2SiO_{3/2}]$.

It should be understood that the organosiloxane block copolymers of the embodiments described herein may contain additional siloxy units, such as M siloxy units, Q siloxy units, other unique D or T siloxy units (for example having organic groups other than $R^1$ or $R^2$), provided that the organosiloxane block copolymer contains the mole fractions of the disiloxy and trisiloxy units as described herein. In other words, the sum of the mole fractions as designated by subscripts a and b, do not necessarily have to sum to one. The sum of a+b may be less than one to account for minor amounts of other siloxy units that may be present in the organosiloxane block copolymer. Alternatively, the sum of a+b is greater than 0.6, alternatively greater than 0.7, alternatively greater than 0.8, or alternatively greater than 0.9. In some embodiments, the sum of a+b is from about 0.6 to about 0.9, e.g., from about 0.6 to about 0.8, from about 0.6 to about 0.7, from about 0.7 to about 0.9, from about 0.7 to about 0.8, or from about 0.8 to about 0.9.

In one embodiment, the organosiloxane block copolymer consists essentially of the disiloxy units of the formula $[R^1_2SiO_{2/2}]$ and trisiloxy units of the formula $[R^2SiO_{3/2}]$, while also containing 0.5 to 25 mole percent silanol groups [SiOH] (e.g., 0.5 to 5 mole percent, 0.5 to 10 mole percent, 0.5 to 15 mole percent, 0.5 to 20 mole percent, 5 to 10 mole percent, 5 to 15 mole percent, 5 to 20 mole percent, 5 to 25 mole percent, 10 to 15 mole percent 10 to 20 mole percent, 10 to 25 mole percent, 15 to 20 mole percent, 15 to 25 mole percent, or 20 to 25 mole percent), where $R^1$ and $R^2$ are as defined herein. Thus, in some embodiments, the sum of a+b (when using mole fractions to represent the amount of disiloxy and trisiloxy units in the copolymer) is greater than 0.95, alternatively greater than 0.98.

In some embodiments, the resin-linear organosiloxane block copolymers may also contain from 0.5 to 35 mole percent silanol groups [≡SiOH], alternatively from 2 to 32 mole percent silanol groups [≡SiOH], and alternatively from 8 to 22 mole percent silanol groups [≡SiOH].

The silanol groups may be present on any siloxy units within the organosiloxane block copolymer. The amount described herein represent the total amount of silanol groups found in the organosiloxane block copolymer. In some embodiments, the majority (e.g., greater than 75%, greater than 80%, greater than 90%; from about 75% to about 90%, from about 80% to about 90%, or from about 75% to about 85%) of the silanol groups may reside on the trisiloxy units, i.e., the resin component of the block copolymer. Although not wishing to be bound by any theory, the silanol groups present on the resin component of the organosiloxane block copolymer allows for the block copolymer to further react or cure at elevated temperatures.

At each occurrence, each $R^1$ in the above disiloxy unit is independently a $C_1$ to $C_{30}$ hydrocarbyl, where the hydrocarbyl group may independently be an alkyl, aryl, or alkylaryl group. Each $R^1$, at each occurrence, may independently be a $C_1$ to $C_{30}$ alkyl group, alternatively each $R^1$, at each occurrence, may independently be a $C_1$ to $C_{18}$ alkyl group. Alternatively, at each occurrence, each $R^1$ may independently be a $C_1$ to $C_6$ alkyl group such as methyl, ethyl, propyl, butyl, pentyl, or hexyl. Alternatively, at each occurrence, each $R^1$ may independently be methyl. Each $R^1$, at each occurrence, may independently be an aryl group, such as phenyl, naphthyl or an anthryl group. Alternatively, at each occurrence, each $R^1$ may independently be any combination of the aforementioned alkyl or aryl groups. Alternatively, at each occurrence, each $R^1$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

At each occurrence, each $R^2$ in the above trisiloxy unit is independently a $C_1$ to $C_{20}$ hydrocarbyl (e.g., $C_1$ to $C_{10}$ hydrocarbyl), where the hydrocarbyl group may independently be an alkyl, aryl, or alkylaryl group. Each $R^2$, at each occurrence, may independently be a $C_1$ to $C_{20}$ (e.g., $C_1$ to $C_{10}$ hydrocarbyl) alkyl group, alternatively each $R^2$, at each occurrence, may independently be a $C_1$ to $C_8$ alkyl group. Alternatively, at each occurrence, each $R^2$ may independently be a $C_1$ to $C_6$ alkyl group such as methyl, ethyl, propyl, butyl, pentyl, or hexyl. Alternatively, at each occurrence, each $R^2$ may independently be methyl. Each $R^2$, at each occurrence, may independently be an aryl group, such as phenyl, naphthyl or an anthryl group. Alternatively, at each occurrence, each $R^2$ may independently be any combination of the aforementioned alkyl or aryl groups. Alternatively, at each occurrence, each $R^2$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

As used herein, hydrocarbyl also includes substituted hydrocarbyls. "Substituted" as used herein refers broadly to replacement of one or more of the hydrogen atoms of the group with substituents known to those skilled in the art and resulting in a stable compound as described herein. Examples of suitable substituents include, but are not limited to, alkyl, alkenyl, alkynyl, cycloalkyl, aryl, alkaryl, hydroxy, alkoxy, aryloxy, carboxy (i.e., $CO_2H$), carboxyalkyl, carboxyaryl, cyano, nitro and the like. Substituted hydrocabyl also includes halogen substituted hydrocarbyls, where the halogen may be fluorine, chlorine, bromine or combinations thereof.

In some embodiments, the organosiloxane block copolymer comprised in component A) includes fluorinated organosiloxane block compolymers described in U.S. Provisional Patent Appl. Ser. No. 61/608,732, filed Mar. 9, 2012; and PCT Appl. No. PCT/US2013/027904, filed Feb. 27, 2013, the entire disclosures of both which are incorporated by reference as if fully set forth herein. The fluorinated organosiloxane block copolymers may be used in addition to, or in place of the non-fluorinated analogs described herein.

The formula $[R^1_2SiO_{2/2}]_a[R_2SiO_{3/2}]_b$, and related formulae using mole fractions, as used herein to describe the organosiloxane block copolymers, does not indicate structural ordering of the disiloxy $[R^1_2SiO_{2/2}]$ and trisiloxy $[R^2SiO_{3/2}]$ units in the copolymer. Rather, this formula is meant to provide a convenient notation to describe the relative amounts of the two units in the copolymer, as per the mole fractions described herein via the subscripts a and b. The mole fractions of the various siloxy units in the present organosiloxane block copolymers, as well as the silanol content, may be readily determined by $^{29}Si$ NMR techniques.

The organosiloxane block copolymers of the embodiments described herein have a weight average molecular weight ($M_w$) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymers of the embodiments described herein have a weight average molecular weight ($M_w$) of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In some embodiments, the organosiloxane block copolymers of the embodiments described herein have a number average molecular weight ($M_n$) of from about 15,000 to about 50,000 g/mole; from about 15,000 to about 30,000 g/mole; from about 20,000 to about 30,000 g/mole; or from about 20,000 to about 25,000 g/mole. The average molecular weight may be readily determined using Gel Permeation Chromatography (GPC) techniques.

In some embodiments, the structural ordering of the disiloxy and trisiloxy units may be further described as follows: the disiloxy units $[R^1_2SiO_{2/2}]$ are arranged in linear blocks having an average of from 10 to 400 disiloxy units $[R^1_2SiO_{2/2}]$ per linear block, and the trisiloxy units $[R^2SiO_{3/2}]$ are arranged in non-linear blocks having a molecular weight of at least 500 g/mole. Each linear block is linked to at least one non-linear block in the block copolymer. Furthermore, at least 30% of the non-linear blocks are crosslinked with each other, alternatively at least at 40% of the non-linear blocks are crosslinked with each other, alternatively at least at 50% of the non-linear blocks are crosslinked with each other, wherein all of the percentages given herein to indicate percent non-linear blocks that are crosslinked are in weight percent.

In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The crosslinking of the non-linear blocks may be accomplished via a variety of chemical mechanisms and/or moieties. For example, crosslinking of non-linear blocks within the block copolymer may result from the condensation of residual silanol groups present in the non-linear blocks of the copolymer. Crosslinking of the non-linear blocks within the block copolymer may also occur between "free resin" components and the non-linear blocks. "Free resin" components may be present in the block copolymer compositions as a result of using an excess amount of an organosiloxane resin during the preparation of the block copolymer. The free resin component may crosslink with the non-linear blocks by condensation of the residual silanol groups present on the non-linear and on the free resin. The free resin may provide crosslinking by reacting with lower molecular weight compounds added as crosslinkers, as described herein. The free resin, when present, may be present in an amount of from about 10% to about 20% by weight of the organosiloxane block copolymers of the embodiments described herein, e.g., from about 15% to about 20% by weight organosiloxane block copolymers of the embodiments described herein.

In some embodiments, certain compounds may be added during the preparation of the block copolymer, e.g., as crosslinkers. These compounds may include an organosilane having the formula $R^7_q SiX_{4-q}$, which is added during the formation of the block copolymer (step II as discussed herein), where $R^7$ is a $C_1$ to $C_8$ hydrocarbyl or a $C_1$ to $C_8$ halogen-substituted hydrocarbyl; X is a hydrolyzable group; and q is 0, 1, or 2. $R^7$ is a $C_1$ to $C_8$ hydrocarbyl or a $C_1$ to $C_8$ halogen-substituted hydrocarbyl, or alternatively $R^7$ is a $C_1$ to $C_8$ alkyl group, or alternatively a phenyl group, or alternatively $R^7$ is methyl, ethyl, or a combination of methyl and ethyl. X is any hydrolyzable group, E or, alternatively, X may be an oximo, acetoxy, halogen atom, hydroxyl (OH), or an alkoxy group.

In one embodiment, the organosilane having the formula $R^7_q SiX_{4-q}$ is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.).

Other suitable, non-limiting organosilanes useful, e.g., as crosslinkers include; methyl-tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, and methyl tris(methylmethylketoxime)silane.

The crosslinks within the block copolymer may primarily be siloxane bonds, ≡Si—O—Si≡, resulting from the condensation of silanol groups, as discussed herein.

The amount of crosslinking in the block copolymer may be estimated by determining the average molecular weight of the block copolymer, such as with GPC techniques. In some embodiments, crosslinking the block copolymer increases its average molecular weight. Thus, an estimation of the extent of crosslinking may be made, given the average molecular weight of the block copolymer, the selection of the linear siloxy component (that is the chain length as indicated by its degree of polymerization), and the molecular weight of the non-linear block (which is primarily controlled by the selection of the organosiloxane resin used to prepare the block copolymer).

In some embodiments, component A) may further comprise an organic solvent. The organic solvent is, in some embodiments, an aromatic solvent, such as benzene, toluene, xylene, or combinations thereof. Such solutions, in some embodiments, containing from about 50 wt % to about 80 wt % solids, e.g., from about 60 wt % to about 80 wt %, from about 70 wt % to about 80 wt % or from about 75 wt % to about 80 wt % solids. In some embodiments, the solvent is toluene. In some embodiments, such solutions will have a viscosity of from about 500 cSt to about 10000 cSt at 25° C., e.g., from about 1500 cSt to about 10000 cSt, from about 1000 cSt to about 10000 cSt, from about 1500 cSt to about 6000 cSt, from about 1000 cSt to about 4000 cSt, from about 2000 cSt to about 3000 cSt or from about 500 cSt to about 3000 cSt at 25° C.

Component A) may further contain an organosiloxane resin (e.g., free resin that is not part of the block copolymer). The organosiloxane resin present in these compositions, in some embodiments, may be the organosiloxane resin used to prepare the organosiloxane block copolymer. Thus, the organosiloxane resin may comprise at least 60 mol % of $[R^2SiO_{3/2}]$ siloxy units in its formula (e.g., at least 70 mol % of $[R^2SiO_{3/2}]$ siloxy units, at least 80 mole % of $[R^2SiO_{3/2}]$ siloxy units, at least 90 mole % of $[R^2SiO_{3/2}]$ siloxy units, or 100 mole % of $[R^2SiO_{3/2}]$ siloxy units; or 60-100 mole % $[R^2SiO_{3/2}]$ siloxy units, 60-90 mole % $[R^2SiO_{3/2}]$ siloxy units or 70-80 mole % $[R^2SiO_{3/2}]$ siloxy units), where each $R^2$ is independently a $C_1$ to $C_{20}$ hydrocarbyl. Alternatively, the organosiloxane resin is a silsesquioxane resin, or alternatively a phenyl silsesquioxane resin.

In one embodiment, component A), which, in some embodiments comprises curable compositions, may contain a cure catalyst. The cure catalyst may be selected from any catalyst known in the art to effect condensation or moisture cure of organosiloxanes, such as various tin or titanium catalysts. The cure catalyst can be any cure catalyst that may be used to promote condensation of silicon bonded hydroxy (=silanol) groups to form Si—O—Si linkages. Examples include, but are not limited to, amines and complexes of lead, tin, titanium, zinc, and iron. Other examples include, but are not limited to basic compounds, such as trimethylbenzylammonium hydroxide, tetramethylammonium hydroxide, n-hexylamine, tributylamine, diazabicycloundecene (DBU) and dicyandiamide; and metal-containing compounds such as tetraisopropyl titanate, tetrabutyl titanate, titanium acetylacetonate, aluminum triisobutoxide, aluminum triisopropoxide, zirconium tetra(acetylacetonato), zirconium tetrabutylate, cobalt octylate, cobalt acetylacetonato, iron acetylacetonato, tin acetylacetonato, dibutyltin octylate, dibutyltin laurate, zinc octylate, zinc bezoate, zinc p-tert-butylbenzoate, zinc laurate, zinc stearate, aluminium phosphate, and alminium triisopropoxide; organic titanium chelates such as aluminium trisacetylacetonate, aluminium bisethylacetoacetate monoacetylacetonate, diisopropoxybis(ethylacetoacetate)titanium, and diisopropoxybis(ethylacetoacetate)titanium. In some embodiments, the condensation catalysts include zinc octylate, zinc bezoate, zinc p-tert-butylbenzoate, zinc laurate, zinc stearate, aluminium phosphate, and aluminum triisopropoxide. See, e.g., U.S. Pat. No. 8,193,269, the entire disclosure of which is incorporated by reference as if fully set forth herein. Other examples of catalysts include, but are not limited to aluminum alkoxides, antimony alkoxides, barium alkoxides, boron alkoxides, calcium alkoxides, cerium alkoxides, erbium alkoxides, gallium alkoxides, silicon alkoxides, germanium alkoxides, hafnium alkoxides, indium alkoxides, iron alkoxides, lanthanum alkoxides, magnesium alkoxides, neodymium alkoxides, samarium alkoxides, strontium alkoxides, tantalum alkoxides, titanium alkoxides, tin alkoxides, vanadium alkoxide oxides, yttrium alkoxides, zinc alkoxides, zirconium alkoxides, titanium or zirconium compounds, especially titanium and zirconium alkoxides, and chelates and oligo- and polycondensates of the above alkoxides, dialkyltin diacetate, tin (II) octoate, dialkyltin diacylate, dialkyltin oxide and double metal alkoxides. Double metal alkoxides are alkoxides containing two different metals in a particular ratio. In some embodiments, the condensation catalysts include titanium tetraethylate, titanium tetrapropylate, titanium tetraisopropylate, titanium tetrabutylate, titanium tetraisooctylate, titanium isopropylate tristearoylate, titanium truisopropylate stearoylate, titanium diisopropylate distearoylate, zirconium tetrapropylate, zirconium tetraisopropylate, zirconium tetrabutylate. See, e.g., U.S. Pat. No. 7,005, 460, the entire disclosure of which is incorporated by reference as if fully set forth herein. In addition, the condensation catalysts include titanates, zirconates and hafnates as described in DE 4427528 C2 and EP 0 639 622 B1, both of which are incorporated by reference as if fully set forth herein.

The organosiloxane block copolymer of the embodiments described herein for use as component A) may be prepared by the methods known in the art, including the methods disclosed in Appl. Nos. WO2012/040302; WO2012/040305; WO2012/040367; WO2012/040453; and WO2012/040457, which are incorporated by reference as if fully set forth herein.

In some embodiments, solid compositions, which include a resin-linear organosiloxane block copolymer of some of the embodiments described herein for use as component A) also contain a superbase catalyst. See, e.g., PCT Appl. No. PCT/US2012/069701, filed Dec. 14, 2012; and U.S. Provisional Appl. No. 61/570,477, filed Dec. 14, 2012, the entireties of which are incorporated by reference as if fully set forth herein.

In some embodiments, solid compositions, which include a resin-linear organosiloxane block copolymer of some of the embodiments described herein for use as component A) also contain a stabilizer. See, e.g., PCT Appl. No. PCT/US2012/067334, filed Nov. 30, 2012; and U.S. Provisional Appl. No. 61/566,031, filed Dec. 2, 2011, the entireties of which are incorporated by reference as if fully set forth herein.

In one embodiment, the organosiloxane block copolymer selected as component A) is prepared according to the methods described in PCT Application No. WO2012/040302, which comprise:
I) reacting
a) a linear organosiloxane having the formula $R^1{}_q(E)_{(3-q)}SiO(R^1{}_2SiO_{2/2})_nSi(E)_{(3-q)}R^1{}_q$, wherein each $R^1$, at each occurrence, is independently a $C_1$ to $C_{30}$ hydrocarbyl,
n is 10 to 400,
q is 0, 1 or 2,
E is a hydrolyzable group containing at least one carbon atom, and
b) an organosiloxane resin comprising at least 60 mole % of $[R^2SiO_{3/2}]$ siloxy units in its formula, wherein each $R^2$, at each occurrence, is independently a $C_1$ to $C_{20}$ hydrocarbyl,
in c) an organic solvent;
to form a resin-linear organosiloxane block copolymer;
wherein the amounts of a) and b) used in step I are selected to provide the resin-linear organosiloxane block copolymer with 40 to 90 mole % of disiloxy units $[R^1{}_2SiO_{2/2}]$ and 10 to 60 mole % of trisiloxy units $[R^2SiO_{3/2}]$, and wherein at least 95 weight percent of the linear organosiloxane used in step I is incorporated into the resin-linear organosiloxane block copolymer; and
II) reacting the resin-linear organosiloxane block copolymer from step i) and organosilane having the formula $R^6{}_qSiX_{4-q}$, wherein $R^6$ is a $C_1$ to $C_8$ hydrocarbyl or a $C_1$ to $C_8$ halogen-substituted hydrocarbyl, X is a hydrolyzable group, and q is 0, 1, or 2;
to crosslink the trisiloxy units of the resin-linear organosiloxane block copolymer sufficiently to increase the weight average molecular weight ($M_w$) of the resin-linear organosiloxane block copolymer by at least 50%.

In a further embodiment, resin-linear organosiloxane block copolymer prepared according to the method of PCT Application No. WO2012/040302 may be considered as an "acetoxy" based composition when E is $H_3CC(=O)O$— (acetoxy) in the linear organosiloxane selected as component a) and an alkyltriacetoxysilane is used in step II to crosslink the resin-linear organosiloxane block copolymer from step I.

Alternatively, organosiloxane block copolymer compositions suitable as component A) may be prepared using hydrosilylation methods, such as those described in U.S. Provisional Appl. Ser. No. 61/609,431, filed Mar. 12, 2012 and PCT. Application No. PCT/US2013/028580, filed Mar. 1, 2013, the entireties of both of which are incorporated by reference as if fully set forth herein. Briefly, such methods comprise:
I) reacting
a) a linear organosiloxane having the formula $R^{1'}{}_qR^3{}_{(3-q)}SiO(R^1{}_2SiO_{2/2})_nSiR^3{}_{(3-q)}R^{1'}{}_q$, wherein:
each $R^{1'}$, at each occurrence, is independently a $C_1$ to $C_{30}$ hydrocarbyl free of aliphatic unsaturation,
each $R^3$, at each occurrence, is independently H, $R^{1'}$, or $R^4$, wherein each $R^4$, at each occurrence, is independently a $C_2$ to $C_{12}$ hydrocarbyl group having at least one aliphatic unsaturated bond, and
n is 10 to 400, q is 0, 1, or 2;
b) an organosiloxane resin having the average formula:

$[R^{2'}{}_2R^3SiO_{1/2}]_a[R^{2'}R^3SiO_{2/2}]_b[R^3SiO_{3/2}]_c[R^{2'}SiO_{3/2}]_d[SiO_{4/2}]_e$, wherein:
each $R^{2'}$, at each occurrence, is independently a $C_1$ to $C_{20}$ hydrocarbyl free of aliphatic unsaturation,
each $R^3$, at each occurrence, is independently H, $R^{1'}$ or $R^4$,
wherein each $R^4$, at each occurrence, is a $C_2$ to $C_{12}$ hydrocarbyl group having at least one aliphatic unsaturated bond,
the subscripts a, b, c, d, and e represent the mole fraction of each siloxy unit present in the organosiloxane resin and range as follows:
a is about 0 to about 0.7,
b is about 0 to about 0.3,
c is about 0 to about 0.8,
d is about 0 to about 0.9,
e is about 0 to about 0.7,
with the provisos that a+b+c>0, c+d+e≥0.6, and a+b+c+d+e≈1,
with the proviso that at least one $R^3$ substituent is H on either of the linear organosiloxane or organosiloxane resin, and at least one $R^3$ substituent is $R^4$ on the other organosiloxane; and c) a hydrosilylation catalyst;
   in an organic solvent;
      to form a resin-linear organosiloxane block copolymer;
      wherein the amounts of a) and b) used in step I are selected to provide the resin-linear organosiloxane block copolymer with 40 to 90 mole % of disiloxy units [$R^{1'}_2SiO_{2/2}$] and 10 to 60 mole % of [$R^{2'}SiO_{3/2}$] and/or [$SiO_{4/2}$] siloxy units, and
      wherein at least 95 weight percent of the linear organosiloxane added in step I is incorporated into the resin-linear organosiloxane block copolymer;
   II) reacting the resin-linear organosiloxane block copolymer from step I) to crosslink the [$R^{2'}SiO_{3/2}$] and/or [$SiO_{4/2}$] siloxy units of the resin-linear organosiloxane block copolymer sufficiently to increase the weight average molecular weight ($M_W$) of the resin-linear organosiloxane block copolymer by at least 50%.

Those of skill in the art will recognize that the organosiloxane block copolymer compositions suitable as component A) will contain dilsiloxy units [$R^{1'}_2SiO_{2/2}$] and trisiloxy [$R^{2'}SiO_{3/2}$]; or dilsiloxy units [$R^1_2SiO_{2/2}$] and trisiloxy units [$R^2SiO_{3/2}$], depending on the starting linear organosiloxane component a) and the organosiloxane resin component b) that are used to generate the organosiloxane block copolymer compositions suitable as component A). However, because $R^{1'}$ in the dilsiloxy units [$R^{1'}_2SiO_{2/2}$] is broadly defined herein as "$C_1$ to $C_{30}$ hydrocarbyl free of aliphatic unsaturation" and $R^1$ in the dilsiloxy units [$R^1_2SiO_{2/2}$] is broadly defined herein as "$C_1$ to $C_{30}$ hydrocarbyl," those of skill in the art will recognize that "$C_1$ to $C_{30}$ hydrocarbyl" encompasses "$C_1$ to $C_{30}$ hydrocarbyl free of aliphatic unsaturation." The same holds true for trisiloxy units [$R^2SiO_{3/2}$] and [$R^{2'}SiO_{3/2}$]: those of skill in the art will recognize that "$C_1$ to $C_{20}$ hydrocarbyl" encompasses "$C_1$ to $C_{20}$ hydrocarbyl free of aliphatic unsaturation."

The reaction effected in step I is a hydrosilylation reaction. Hydrosilylation involves the catalytically enhanced reaction of a molecule containing Si—H units and a molecule containing an unsaturated aliphatic hydrocarbon in which the SiH bond adds across the unsaturated group to form a Si—C bond. In the hydrosilylation reaction of step I, the Si—H units may be present on either component a) or b). Likewise, the aliphatic unsaturated bond may be present on either component a) or b). However, if the Si—H units are present on component a), then component b) should contain aliphatic unsaturated bonds for the hydrosilylation reaction to proceed between the two components. Conversely, if the Si—H units are present on component b), then component a) should contain aliphatic unsaturated bonds for the hydrosilylation reaction to proceed.

The Linear Organosiloxane

In one embodiment, component a) is a linear organosiloxane having the formula $R^{1'}_q R^3_{(3-q)}SiO(R^{1'}_2SiO_{2/2})_n SiR^3_{(3-q)}R^{1'}_q$, wherein each $R^{1'}$, at each occurrence, is independently a $C_1$ to $C_{30}$ hydrocarbyl free of aliphatic unsaturation; each $R^3$, at each occurrence, is independently H, $R^{1'}$, or $R^4$, wherein each $R^4$, at each occurrence, is a $C_2$ to $C_{12}$ hydrocarbyl group having at least one aliphatic unsaturated bond; n is 10 to 400; and q is 0, 1, or 2. The subscript "n" may be considered as the degree of polymerization (dp) of the linear organosiloxane and may vary from 10 to 400 (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units).

While component a) is described as a linear organosiloxane having the formula $R^{1'}_q R^3_{(3-q)}SiO(R^{1'}_2SiO_{2/2})_n SiR^3_{(3-q)}R^{1'}_q$, one skilled in the art recognizes small amount of alternative siloxy units, such a T ($R^{1'}SiO_{3/2}$) siloxy units, may be incorporated into the linear organosiloxane of component a). As such, the organosiloxane may be considered as being "predominately" linear by having a majority of D ($R^{1'}_2SiO_{2/2}$) siloxy units. Furthermore, the linear organosiloxane used as component a) may be a combination of several linear organosiloxanes. Still further, the linear organosiloxane used as component a) may comprise silanol groups. In some embodiments, the linear organosiloxane used as component a) comprises from about 0.5 to about 5 mole % silanol groups, e.g., from about 1 mole % to about 3 mole %; from about 1 mole % to about 2 mole % or from about 1 mole % to about 1.5 mole % silanol groups.

At each occurrence, each $R^{1'}$ in the above linear organosiloxane is independently a $C_1$ to $C_{30}$ hydrocarbyl free of aliphatic unsaturation, where the hydrocarbyl group may independently be an alkyl, aryl, or alkylaryl group. Each $R^{1'}$, at each occurrence, may independently be a $C_1$ to $C_{30}$ alkyl group, alternatively each $R^{1'}$, at each occurrence, may independently be a $C_1$ to $C_{18}$ alkyl group. Alternatively, at each occurrence, each $R^{1'}$ may independently be a $C_1$ to $C_6$ alkyl group such as methyl, ethyl, propyl, butyl, pentyl, or hexyl. Alternatively, at each occurrence, each $R^{1'}$ may independently be methyl. Each $R^{1'}$, at each occurrence, may independently be an aryl group, such as phenyl, naphthyl or an anthryl group. Alternatively, at each occurrence, each $R^{1'}$ may independently be any combination of the aforementioned alkyl or aryl groups. Alternatively, at each occurrence, each $R^{1'}$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

Each $R^3$, at each occurrence, is independently H, $R^{1'}$ (as defined herein), or $R^4$, wherein each $R^4$, at each occurrence, is a $C_2$ to $C_{12}$ hydrocarbyl group having at least one aliphatic unsaturated bond, with the understanding that $R^4$ groups having at least one aliphatic unsaturated bond that have reacted with an Si—H group are $C_2$ to $C_{12}$ hydrocarbylene groups that connect, e.g., the components a) and b), described herein.

Examples of aliphatic unsaturated bonds include, but are not limited to, alkenyl or alkynyl bonds. In some embodiments, the aliphatic unsaturated bond in $R^4$ is a terminal double bond. Examples of $C_2$ to $C_{12}$ (e.g., C2 to $C_6$; $C_3$ to Cg; or $C_4$ to $C_{12}$) hydrocabyl groups include, but are not limited to, $H_2C=CH-$, $H_2C=CHCH_2-$, $H_2C=C(CH_3)CH_2-$, $H_2C=CHC(CH_3)_2-$, $H_2C=CHCH_2CH_2-$, $H_2C=CHCH_2CH_2CH_2-$, and $H_2C=CHCH_2CH_2CH_2CH_2-$. Other examples of $C_2$ to $C_{12}$ hydrocabyl groups include, but are not limited to $HC\equiv C-$, $HC\equiv CCH_2-$, $HC\equiv CCH(CH_3)-$, $HC\equiv CC(CH_3)_2-$, and $HC-CC(CH_3)_2CH_2-$. Alternatively $R^4$ is a vinyl group, $H_2C=CH-$.

As used herein, the term "$C_2$ to $C_{12}$ hydrocarbylene" refers broadly to any $C_2$ to $C_{12}$ (e.g., $C_2$ to $C_6$; $C_3$ to $C_8$; or $C_4$ to $C_{12}$) hydrocarbon having two free valences. Such hydrocarbons include, but are not limited to, alkylene groups, including, but not limited to —$H_2CCH_2-$, —$H_2CCH_2CH_2-$, —$H_2CHC(CH_3)CH_2-$, —$H_2CCH_2C(CH_3)_2-$, —$H_2CCH_2CH_2CH_2-$, —$H_2CCH_2CH_2CH_2CH_2-$, and —H$_2$CCH$_2$CH$_2$CH$_2$CH$_2$CH$_2$—; and arylene groups, including, but not limited to phenylene groups (e.g., a phenyl group having two open valences); or combinations of alkylene and arylene groups (e.g., an alkylene-arylene group, where the alkylene group is connected to the arylene group and the alkylene and the arylene groups each have an open valence).

In one embodiment, component a) is a linear organosiloxane having the formula $R^1_q(E)_{(3-q)}SiO(R^1_2SiO_{2/2})_nSi(E)_{(3-q)}R^1_q$, wherein each $R^1$, at each occurrence, is independently a $C_1$ to $C_{30}$ hydrocarbyl, the subscript "n" may be considered as the degree of polymerization (dp) of the linear organosiloxane and may vary from 10 to 400 (e.g., an average of from about 10 to about 400 disiloxy units; about 10 to about 200 disiloxy units; about 10 to about 100 disiloxy units; about 50 to about 400 disiloxy units; about 100 to about 400 disiloxy units; about 150 to about 400 disiloxy units; about 200 to about 400 disiloxy units; about 300 to about 400 disiloxy units; about 50 to about 300 disiloxy units; about 100 to about 300 disiloxy units; about 150 to about 300 disiloxy units; about 200 to about 300 disiloxy units; about 100 to about 150 disiloxy units, about 115 to about 125 disiloxy units, about 90 to about 170 disiloxy units or about 110 to about 140 disiloxy units), the subscript "q" may be 0, 1, or 2, and E is a hydrolyzable group containing at least one carbon atom.

While component a) is described as a linear organosiloxane having the formula $R^1_q(E)_{(3-q)}SiO(R^1_2SiO_{2/2})_nSi(E)_{(3-q)}R^1_q$, one skilled in the art recognizes small amount of alternative siloxy units, such a T [$R^1SiO_{3/2}$] siloxy units, may be incorporated into the linear organosiloxane and still be used as component a). As such, the organosiloxane may be considered as being "predominately" linear by having a majority of D [$R^1_2SiO_{2/2}$] siloxy units. Furthermore, the linear organosiloxane used as component a) may be a combination of several linear organosiloxanes. Still further, the linear organosiloxane used as component a) may comprise silanol groups. In some embodiments, the linear organosiloxane used as component a) comprises from about 0.5 to about 5 mole % silanol groups, e.g., from about 1 mole % to about 3 mole %; from about 1 mole % to about 2 mole % or from about 1 mole % to about 1.5 mole % silanol groups.

At each occurrence, each $R^1$ in the above linear organosiloxane formula is independently a $C_1$ to $C_{30}$ hydrocarbyl, where the hydrocarbyl group may independently be an alkyl, aryl, or alkylaryl group. Each $R^1$, at each occurrence, may independently be a $C_1$ to $C_{30}$ alkyl group, alternatively each $R^1$, at each occurrence, may independently be a $C_1$ to $C_{18}$ alkyl group. Alternatively, at each occurrence, each $R^1$ may independently be a $C_1$ to $C_6$ alkyl group such as methyl, ethyl, propyl, butyl, pentyl, or hexyl. Alternatively, at each occurrence, each $R^1$ may independently be methyl. Each $R^1$, at each occurrence, may independently be an aryl group, such as phenyl, naphthyl or an anthryl group. Alternatively, at each occurrence, each $R^1$ may independently be any combination of the aforementioned alkyl or aryl groups. Alternatively, at each occurrence, each $R^1$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

E may be selected from any hydrolyzable group containing at least one carbon atom. In some embodiments, E is selected from an oximo, epoxy, carboxy, amino, amido group or combinations thereof. Alternatively, E may have the formula $R^1C(=O)O—$, $R^1_2C=N—O—$, or $R^4C=N—O—$, where $R^1$ is as defined herein, and $R^4$ is hydrocarbyl. In one embodiment, E is H$_3$CC(=O)O— (acetoxy) and q is 1. In one embodiment, E is (CH$_3$)(CH$_3$CH$_2$)C=N—O— (methylethylketoximly) and q is 1.

In one embodiment, the linear organosiloxane has the formula (CH$_3$)$_q$(E)$_{(3-q)}$SiO[(CH$_3$)$_2$SiO$_{2/2}$]$_n$Si(E)$_{(3-q)}$(CH$_3$)$_q$, where E, n, and q are as defined herein.

In one embodiment, the linear organosiloxane has the formula (CH$_3$)$_q$(E)$_{(3-q)}$SiO[(CH$_3$)(C$_6$H$_5$)SiO$_{2/2}$]$_n$Si(E)$_{(3-q)}$(CH$_3$)$_q$, where E, n, and q are as defined herein.

Processes for preparing linear organosiloxanes suitable as compounds of the formula $R^1_q(E)_{(3-q)}SiO(R^1_2SiO_{2/2})_nSi(E)_{(3-q)}R^1_q$ are known. In some embodiments, a silanol terminated polydiorganosiloxane is reacted with an "endblocking" compound such as an alkyltriacetoxysilane or a dialkylketoxime. The stoichiometry of the endblocking reaction may be adjusted such that a sufficient amount of the endblocking compound is added to react with all the silanol groups on the polydiorganosiloxane. In some embodiments, a mole of the endblocking compound is used per mole of silanol on the polydiorganosiloxane. Alternatively, a slight molar excess such as 1 to 10% of the endblocking compound may be used. The reaction may be conducted under anhydrous conditions to minimize condensation reactions of the silanol polydiorganosiloxane. In some embodiments, the silanol ended polydiorganosiloxane and the endblocking compound are dissolved in an organic solvent under anhydrous conditions, and allowed to react at room temperature, or at elevated temperatures (up to the boiling point of the solvent).

The Organosiloxane Resin

Component b) may be an organosiloxane resin having the average formula $[R^{2'}_2R^3SiO_{1/2}]_a[R^{2'}R^3SiO_{2/2}]_b[R^3SiO_{3/2}]_c[R^{2'}SiO_{3/2}]_d[SiO_{4/2}]_e$, wherein each $R^{2'}$, at each occurrence, is independently a $C_1$ to $C_{20}$ hydrocarbyl free of aliphatic unsaturation; each $R^3$, at each occurrence, is independently H, $R^{1'}$, or $R^4$, wherein each $R^4$, at each occurrence, is a $C_2$ to $C_{12}$ hydrocarbyl group having at least one aliphatic unsaturated bond; and the subscripts a, b, c, d, and e represent the mole fraction of each siloxy unit present in the organosiloxane resin and range as follows: a is about 0 to about 0.7, b is about 0 to about 0.3, c is about 0 to about 0.8, d is about 0 to about 0.9, e is about 0 to about 0.7, with the provisos that a+b+c>0, c+d+e≥0.6, and a+b+c+d+e≈1.

The organosiloxane resin may contain any amount and combination of other M, D, T, and Q siloxy units, provided the organosiloxane resin contains at least 60 mole % of [$R^{2'}SiO_{3/2}$] (T units) and/or [$SiO_{4/2}$] (Q units) siloxy units, alternatively the organosiloxane resin contains at least 70 mole % of [$R^{2'}SiO_{3/2}$] and/or [$SiO_{4/2}$] siloxy units, at least 80 mole % of [$R^{2'}SiO_{3/2}$] and/or [$SiO_{4/2}$] siloxy units, alternatively the organosiloxane resin contains at least 90 mole % of [$R^{2'}SiO_{3/2}$] and/or [$SiO_{4/2}$] siloxy units, or alternatively the organosiloxane resin contains at least 95 mole % of [$R^{2'}SiO_{3/2}$] and/or [$SiO_{4/2}$] siloxy units. In some embodiments, the organosiloxane resin contains from about 60 to about 100 mole % of [$R^{2'}SiO_{3/2}$] and/or [$SiO_{4/2}$] siloxy units, e.g., from about 60 to about 95 mole % of [$R^{2'}SiO_{3/2}$] and/or [$SiO_{4/2}$] siloxy units, from about 60 to about 85 mole % of [$R^{2'}SiO_{3/2}$] and/or [$SiO_{4/2}$] siloxy units, from about 80 to about 95 mole % of [$R^{2'}SiO_{3/2}$] and/or [$SiO_{4/2}$] siloxy units or from about 90 to about 95 mole % of [$R^{2'}SiO_{3/2}$] and/or [$SiO_{4/2}$] siloxy units. Organosiloxane resins useful as component b) include those known as "silsesquioxane" resins and "MQ" resins including MQ resins where a portion of the M units contain an $R^3$ group as defined herein. MQ resins such as $M^HQ$ or $M^{Vi}Q$, where "Vi" refers broadly to a moiety comprising a vinyl group, include, but are not limited to those disclosed in U.S. Pat. No. 2,857,356, which is incorporated by reference as if fully set forth herein. The '356 patent discloses a method for the preparation of an MQ resin by the cohydrolysis of a mixture of an alkyl silicate and a hydrolyzable trialkylsilane, and an organopolysiloxane with water.

At each occurrence, each $R^{2'}$ in the above organosiloxane resin is independently a $C_1$ to $C_{20}$ hydrocarbyl (e.g., $C_1$ to $C_{10}$ hydrocarbyl) free of aliphatic unsaturation, where the hydrocarbyl group may independently be an alkyl, aryl, or alkylaryl group. Each $R^{2'}$, at each occurrence, may independently be a $C_1$ to $C_{20}$ (e.g., $C_1$ to $C_{10}$ hydrocarbyl) alkyl group, alternatively each $R^{2'}$, at each occurrence, may independently be a $C_1$ to $C_8$ alkyl group. Alternatively, at each occurrence, each $R^{2'}$ may independently be a $C_1$ to $C_6$ alkyl group such as methyl, ethyl, propyl, butyl, pentyl, or hexyl. Alternatively, at each occurrence, each $R^{2'}$ may independently be methyl. Each $R^{2'}$, at each occurrence, may independently be an aryl group, such as phenyl, naphthyl or an anthryl group. Alternatively, at each occurrence, each $R^{2'}$ may independently be any combination of the aforementioned alkyl or aryl groups. Alternatively, at each occurrence, each $R^{2'}$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

The weight average molecular weight ($M_W$) of the organosiloxane resin is not limiting, but, in some embodiments, ranges from 1000 to 10000, or alternatively 1500 to 5000 g/mole.

The organosiloxane resins selected as component b) also contain siloxy units selected from those having a formula $[R^{2'}{}_2R^3SiO_{1/2}]$, $[R^{2'}R^3SiO_{2/2}]$, $[R^3SiO_{3/2}]$, or a combination of these, where $R^3$ is H, $R^1$, or $R^4$ as defined herein. As discussed above, the presence of siloxy units containing the $R^3$ group in the organosiloxane resin provides a reactive substituent for the hydrosilylation reaction in step I). In some embodiments, when $R^3$ is H in the siloxy units on the organosiloxane resin, $R^3$ on the linear organosiloxane may be an $R^4$ group containing an unsaturated aliphatic bond, and vice versa.

The above formulae and related formulae using mole fractions, as used herein to describe the present organosiloxanes, does not indicate structural ordering of the various siloxy units in the copolymer. Rather, this formula is meant to provide a convenient notation to describe the relative amounts of the siloxy units in the copolymer, as per the mole fractions described herein via the subscripts. The mole fractions of the various siloxy units in the present organosiloxanes, as well as the silanol content, may be readily determined by $^{29}$Si NMR techniques.

Representative, non-limiting examples of Si—H-containing organosiloxane resins (i.e., where $R^3$ is H) of the above formula include, but are not limited to:

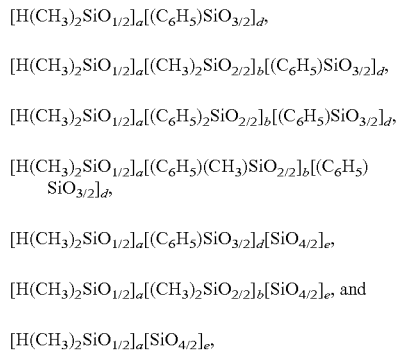

where the subscripts a, b, c, d, and e are as defined herein.

Representative, non-limiting examples of organosiloxane resins containing an unsaturated aliphatic bond (i.e., $R^3$ is $R^4$) of the above formula include:

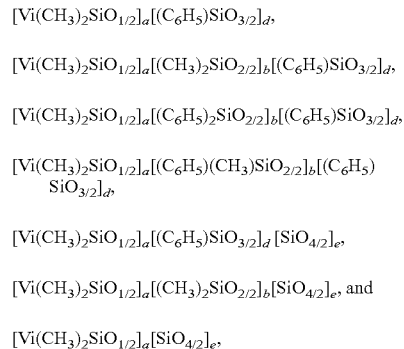

where the subscripts a, b, c, d, and e are as defined herein and "Vi" refers broadly to a moiety comprising a vinyl group.

In other embodiments, component b) may be an organosiloxane resin comprising at least 60 mole % of $[R^2SiO_{3/2}]$ siloxy units in its formula, wherein each $R^2$ is independently a $C_1$ to $C_{20}$ hydrocarbyl. The organosiloxane resin may contain any amount and combination of other M, D, and Q siloxy units, provided the organosiloxane resin contains at least 70 mole % of [R2SiO_{3/2}] siloxy units, alternatively the organosiloxane resin contains at least 80 mole % of $[R^2SiO_{3/2}]$ siloxy units, alternatively the organosiloxane resin contains at least 90 mole % of $[R^2SiO_{3/2}]$ siloxy units, or alternatively the organosiloxane resin contains at least 95 mole % of $[R^2SiO_{3/2}]$ siloxy units. In some embodiments, the organosiloxane resin contains from about 70 to about 100 mole % of $[R^2SiO_{3/2}]$ siloxy units, e.g., from about 70 to about 95 mole % of $[R2SiO_{3/2}]$ siloxy units, from about 80 to about 95 mole % of $[R^2SiO_{3/2}]$ siloxy units or from about 90 to about 95 mole % of $[R^2SiO_{3/2}]$ siloxy units. Organosiloxane resins useful as component b) include those known as "silsesquioxane" resins.

At each occurrence, each $R^2$ is independently a $C_1$ to $C_{20}$ hydrocarbyl (e.g., $C_1$ to $C_{10}$ hydrocarbyl), where the hydrocarbyl group may independently be an alkyl, aryl, or alkylaryl group. Each $R^2$, at each occurrence, may independently be a $C_1$ to $C_{20}$ (e.g., $C_1$ to $C_{10}$ hydrocarbyl) alkyl group, alternatively each $R^2$, at each occurrence, may independently be a $C_1$ to $C_8$ alkyl group. Alternatively, at each occurrence, each $R^2$ may independently be a $C_1$ to $C_6$ alkyl group such as methyl, ethyl, propyl, butyl, pentyl, or hexyl. Alternatively, at each occurrence, each $R^2$ may independently be methyl. Each $R^2$, at each occurrence, may independently be an aryl group, such as phenyl, naphthyl or an anthryl group. Alternatively, at each occurrence, each $R^2$ may independently be any combination of the aforementioned alkyl or aryl groups. Alternatively, at each occurrence, each $R^2$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

The weight average molecular weight ($M_W$) of the organosiloxane resin is not limiting, but, in some embodiments, ranges from 1000 to 10000, or alternatively 1500 to 5000 g/mole.

One skilled in the art recognizes that organosiloxane resins containing such high amounts of $[R^2SiO_{3/2}]$ or $[R^{2'}SiO_{3/2}]$ siloxy units may have a certain concentration of Si—OZ where Z may be hydrogen (i.e., silanol) or an alkyl group (so that OZ is an alkoxy group). The Si—OZ content as a mole percentage of all siloxy groups present on the organosiloxane resin may be readily determined by $^{29}$Si NMR. The concentration of the OZ groups present on the organosiloxane resin may vary, as dependent on the mode of preparation, and subsequent treatment of the resin. In some embodiments, the silanol (Si—OH) content of organosiloxane resins suitable for use in the present process will have a silanol content of at least 5 mole %, alternatively of at least 10 mole %, alternatively 25 mole %, alternatively 40 mole %, or alternatively 50 mole %. In other embodiments, the silanol content is from about 5 mole % to about 60 mole %, e.g., from about 10 mole % to about 60 mole %, from about 25 mole % to about 60 mole %, from about 40 mole % to about 60 mole %, from about 25 mole % to about 40 mole % or from about 25 mole % to about 50 mole %.

One skilled in the art further recognizes that organosiloxane resins containing such high amounts of $[R^2SiO_{3/2}]$ or $[R^{2'}SiO_{3/2}]$ siloxy units and silanol contents may also retain water molecules, especially in high humidity conditions. Thus, it is often beneficial to remove excess water present on the resin by "drying" the organosiloxane resin prior to reacting in step I. This may be achieved by dissolving the organosiloxane resin in an organic solvent, heating to reflux, and removing water by separation techniques (for example Dean Stark trap or equivalent process).

Organosiloxane resins containing at least 60 mole % of $[R^2SiO_{3/2}]$, $[R^{2'}SiO_{3/2}]$ or $[SiO_{4/2}]$ siloxy units, and, in some embodiments, at least two siloxy units selected from those having a formula $[R^{2'}{}_2R^3SiO_{1/2}]$, $[R^{2'}R^3SiO_{2/2}]$, $[R^3SiO_{3/2}]$, or a combination of these, and methods for preparing them are known in the art. In some embodiments, they are prepared by hydrolyzing an organosilane having three hydrolyzable groups on the silicon atom, such as a halogen or an alkoxy group in an organic solvent. A representative example for the preparation of a silsesquioxane resin may be found in U.S. Pat. No. 5,075,103. Furthermore, many organosiloxane resins are available commercially and sold either as a solid (flake or powder), or dissolved in an organic solvent. Suitable, non-limiting, commercially available organosiloxane resins useful as component b) include; Dow Corning® 217 Flake Resin, 233 Flake, 220 Flake, 249 Flake, 255 Flake, Z-6018 Flake (Dow Corning Corporation, Midland Mich.). It should be mentioned however, that such resins would have to be modified to include an Si—H bond or unsaturated groups, such as vinyl groups. Method for modifying such commercially available resins are known in the art.

The amounts of a) and b) used in the reaction of step I are selected to provide the resin-linear organosiloxane block copolymer with 40 to 90 mole % of disiloxy units $[R^1{}_2SiO_{2/2}]$ or $[R^{1'}{}_2SiO_{2/2}]$ and 10 to 60 mole % of trisiloxy units $[R^2SiO_{3/2}]$, $[R^{2'}SiO_{3/2}]$ and/or $[SiO_{4/2}]$ units. The mole % of disiloxy and trisiloxy units present in components a) and b) may be readily determined using $^{29}$Si NMR techniques. The starting mole % then determines the mass amounts of components a) and b) used in step I.

In some embodiments, the amounts of components a) and b) used in step I are selected to provide a Si—H/unsaturated bond ratio, depending on the molar quantity of Si—H units and unsaturated bonds present in the components. In some embodiments, the molar ratio of Si—H/unsaturated bonds may vary from 10/1 to 1/10 (e.g., 8:1 to 1:8; 7:1 to 1:7; 6:1 to 1:6; 5:1 to 1:5; 4:1 to 1:4; 3:1 to 1:3; 2:1 to 1:2; and 1:1). In certain embodiments, the molar ratio of Si—H/unsaturated bonds provides a molar excess of Si—H units in the reaction so as to ensure Si—H units remain on the formed resin-linear organosiloxane block copolymer of step I. In one embodiment, the molar ratio of Si—H/unsaturated bonds varies from 10/1 to 1.5/1, e.g., 7:1, 6:1, 5:1, 3:1, 2:1 or 1.5:1.

In some embodiments, the amounts of components a) and b) are selected to ensure that a sufficient amount of the organosiloxane resin is added such that a majority (e.g., greater than 75%, greater than 80%, greater than 90%; greater than 95%; or greater than 99%; or from about 75% to about 95%, from about 80% to about 90%, or from about 75% to about 85%) of linear organosiloxane added in step I) react with the resin. These amounts may be calculated based on the molar quantities of Si—H and unsaturated groups present initially on components a) and b). In some embodiments these amounts are selected to allow at least 95 weight percent of the linear organosiloxane added in step I to be incorporated into the resin-linear organosiloxane block copolymer formed in step I.

In one embodiment of the process, the amounts and selection of components a) and b) used in step I are such that the resulting resin-linear organopolysiloxane block copolymer has negligible or no residual Si—H units. In other embodiments of the process, the amounts and selection of components a) and b) used in step I are such that the resulting resin-linear organopolysiloxane block copolymer has negligible or no residual aliphatic unsaturation.

Component c) is a hydrosilylation catalyst. The hydrosilylation catalyst may be any suitable Group VIII metal based catalyst selected from a platinum, rhodium, iridium, palladium or ruthenium. Group VIII group metal containing catalysts useful to catalyze the hydrosilylation reaction can be any catalyst known to catalyze reactions of silicon bonded hydrogen atoms with silicon bonded moieties comprising unsaturated hydrocarbon groups. In some embodiments, the Group VIII metal for use as a catalyst to effect the hydrosilylation is a platinum based catalyst such as platinum metal, platinum compounds and platinum complexes.

Suitable platinum catalysts include, but are not limited to, the catalyst described in U.S. Pat. No. 2,823,218 (e.g., "Speier's catalyst") and U.S. Pat. No. 3,923,705, the entireties of both of which are incorporated by reference as if fully set forth herein. Other suitable platinum catalysts include, but are not limited to, the platinum catalyst referred to as "Karstedt's catalyst," which are described in U.S. Pat. Nos. 3,715,334 and 3,814,730. Karstedt's catalyst is a platinum divinyl tetramethyl disiloxane complex, in some cases, containing about one-weight percent of platinum in a solvent such as toluene. Alternatively platinum catalysts include, but are not limited to, the reaction product of chloroplatinic acid and an organosilicon compound containing terminal aliphatic unsaturation, including the catalysts described in U.S. Pat. No. 3,419,593, the entirety of which is incorporated by reference as if fully set forth herein. Alternatively, hydrosilyation catalysts include, but are not limited to, neutralized complexes of platinum chloride and divinyl tetramethyl disiloxane, as described in U.S. Pat. No. 5,175,325. Further suitable hydrosilylation catalysts are described in, for example, U.S. Pat. Nos. 3,159,601; 3,220,972; 3,296,291; 3,516,946; 3,989,668; 4,784,879; 5,036,117; and 5,175,325 and EP 0 347 895 B1.

The hydrosilylation catalyst may be added in an amount equivalent to as little as 0.001 parts by weight of elemental platinum group metal, per one million parts (ppm) of the total reaction composition. In some embodiments, the concentration of the hydrosilylation catalyst in the reaction composition is the concentration capable of providing the equivalent of at least 1 part per million of elemental platinum group metal. A catalyst concentration providing the equivalent of 1 to 500, alternatively 50 to 500, alternatively 50 to 200 parts per million of elemental platinum group metal may be used.

The reaction effected in step I is a hydrosilylation reaction, wherein the Si—H units of component a) or b) react with the unsaturated aliphatic hydrocarbon group of component a) or b) form an Si—C bond. The reaction may be conducted under those conditions known in the art for effecting hydrosilylations reactions.

The hydrosilylation reaction can be conducted neat or in the presence of a solvent. The solvent can be an alcohol such as methanol, ethanol, isopropanol, butanol, or n-propanol; a ketone such as acetone, methylethyl ketone, or methyl isobutyl ketone; an aromatic hydrocarbon such as benzene, toluene, or xylene; an aliphatic hydrocarbon such as heptane, hexane, or octane; a glycol ether such as propylene glycol methyl ether, dipropylene glycol methyl ether, propylene glycol n-butyl ether, propylene glycol n-propyl ether, or ethylene glycol n-butyl ether; a halogenated hydrocarbon such as dichloromethane, 1,1,1-trichloroethane, methylene chloride or chloroform; dimethyl sulfoxide; dimethyl formamide; acetonitrile; tetrahydrofuran; white spirits; mineral spirits; or naphtha. Combinations of one or more of the aforementioned solvents are also contemplated.

The amount of solvent can be up to 70 weight percent (e.g., from about 20 to about 70 weight percent; from about 20 to about 50 weight percent; from about 30 to about 50 weight percent; or from about 40 to about 50 weight percent), but is, in some embodiments, from 20 to 50 weight percent, said weight percent being based on the total weight of components in the hydrosilylation reaction. The solvent used during the hydrosilylation reaction can be subsequently removed from the resulting product by various known methods.

The reaction conditions for reacting the aforementioned (a) linear organosiloxane with the (b) organosiloxane resin are not limited. Various non-limiting embodiments and reaction conditions are described in the Examples herein. In some embodiments, the (a) linear organosiloxane and the (b) organosiloxane resin are reacted at room temperature. In other embodiments, (a) and (b) are reacted at temperatures that exceed room temperature and that range up to about 50, 75, 100, or even up to 150° C. Alternatively, (a) and (b) can be reacted together at reflux of the solvent. In still other embodiments, (a) and (b) are reacted at temperatures that are below room temperature by 5, 10, or even more than 10° C. In still other embodiments (a) and (b) react for times of 1, 5, 10, 30, 60, 120, or 180 minutes, or even longer. In some embodiments, (a) and (b) are reacted under an inert atmosphere, such as nitrogen or a noble gas. Alternatively, (a) and (b) may be reacted under an atmosphere that includes some water vapor and/or oxygen. Moreover, (a) and (b) may be reacted in any size vessel and using any equipment including mixers, vortexers, stirrers, heaters, etc. In other embodiments, (a) and (b) are reacted in one or more organic solvents which may be polar or non-polar, such as the representative solvents mentioned above. The amount of the organosiloxane resin dissolved in the organic solvent may vary, but, in some embodiments, the amount should be selected to minimize the chain extension of the linear organosiloxane or pre-mature condensation of the organosiloxane resin.

The order of addition of components a) and b) may vary. In some embodiments, the linear organosiloxane is added to a solution of the organosiloxane resin dissolved in the organic solvent. In other embodiments, the organosiloxane resin is added to a solution of the linear organosiloxane dissolved in the organic solvent.

The progress of the reaction in step I, and the formation of the resin-linear organosiloxane block copolymer, may be monitored by various analytical techniques, such as GPC, IR, or $^{29}$Si NMR. In some embodiments, the reaction in step I is allowed to continue until at least 95 weight percent (e.g., at least 96%, at least 97%, at least 98%, at least 99% or 100%) of the linear organosiloxane added in step I is incorporated into the resin-linear organosiloxane block copolymer.

Additional components can be added to the hydrosilylation reaction which are known to enhance such reactions. These components include salts such as sodium acetate which have a buffering effect in combination with platinum catalysts.

In one embodiment, component a) has the average formula $H(CH_3)_2SiO[(CH_3)_2SiO_{2/2}]_nSi(CH_3)_2H$, where n may vary from 10 to 400 (e.g., an average of from about 10 to about 400 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and component b) has the average formula $[(H_2C{=}CH)(CH_3)_2SiO_{1/2}]_a[(C_6H_5)SiO_{3/2}]_d[SiO_{4/2}]_e$ where the subscripts a, d, and e are as defined herein.

In one embodiment, component a) has the average formula $(H_2C{=}CH)(CH_3)_2SiO[(CH_3)_2SiO_{2/2}]_nSi(CH_3)_2(HC{=}CH_2)$ where n may vary from 10 to 400 (e.g., an average of from about 10 to about 400 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and component b) has the average formula $[H(CH_3)_2SiO_{1/2}]_a[SiO_{4/2}]_e$ where the subscripts a and e are as defined herein.

In an alternative embodiment, the resin-linear organosiloxane block copolymer of step I may be formed by a hydrosilylation reaction wherein one or more suitable crosslinkers are added in step I), where the crosslinker crosslinks components a) and component b). In some embodiments, $R^3$ is the same on component a) and b), that is $R^3$ is H or $R^4$ on both the linear and resin component. The crosslinker is then selected to react via the hydrosilylation reaction in step I) accordingly.

Suitable crosslinkers may be selected from those having the formula $R^{1'}_q R^3_{(3-q)}SiO(R^{1'}_2SiO_{2/2})_m SiR^3_{(3-q)}R^{1'}_q$ where each $R^{1'}$ is as defined herein; m varies from 0 to 50 (e.g., about 10 to about 50 D units; about 20 to about 50 D units; about 5 to about 40 D units; or about 10 to about 40 D units), alternatively 0 to 10, alternatively 0 to 5, alternatively m is 0; q is 0, 1, or 2, alternatively q is 2; $R^3$ is H, $R^1$, or $R^4$, as each term is defined herein. The crosslinker is added as an additional component in step I. In some embodiments, when $R^3$ is H on both components a) and b), $R^3$ may be, e.g., a $C_2$ to $C_{12}$ hydrocarbyl having at least one aliphatic unsaturated bond on the crosslinker. In other embodiments, if $R^3$ is a $C_2$ to $C_{12}$ hydrocarbyl having at least one aliphatic unsaturated bond on components a) and b), then $R^3$ is H on the crosslinker. The amount of crosslinker added in step I in some embodiments may vary, but is selected, in some embodiments, by molar stoichiometry to provide an amount such that the crosslinker may be substantially (e.g., completely) consumed in the hydrosilylation reaction of step I.

Step II of the present process involves further reacting the resin-linear organosiloxane block copolymer from step I) to crosslink the $[R^2SiO_{3/2}]$, $[R^{2'}SiO_{3/2}]$ or $[SiO_{4/2}]$ siloxy units of the resin-linear organosiloxane block copolymer to increase the molecular weight of the resin-linear organosiloxane block copolymer by at least 50%, alternatively by at least 60%, alternatively by 70%, alternatively by at least 80%, alternatively by at least 90%, or alternatively by at least 100%.

It is believed that the reaction of step II crosslinks the $[R^2SiO_{3/2}]$, $[R^{2'}SiO_{3/2}]$ and/or $[SiO_{4/2}]$ blocks of the resin-linear organosiloxane block copolymer formed in step I, which may increase the average molecular weight of the block copolymer. It is also possible that the crosslinking of the $[R^2SiO_{3/2}]$, $[R^{2'}SiO_{3/2}]$ or $[SiO_{4/2}]$ blocks provides the block copolymer with an aggregated concentration of $[R^2SiO_{3/2}]$, $[R^{2'}SiO_{3/2}]$ or $[SiO_{4/2}]$ blocks, which ultimately may help to form "nano-domains" in solid compositions comprising the block copolymer. In other words, this aggregated concentration of $[R^2SiO_{3/2}]$, $[R^{2'}SiO_{3/2}]$ or $[SiO_{4/2}]$ blocks may phase separate when the block copolymer is isolated in a solid form such as a film or cured coating. The aggregated concentration of $[R^2SiO_{3/2}]$, $[R^{2'}SiO_{3/2}]$ or $[SiO_{4/2}]$ block within the block copolymer and subsequent formation of "nano-domains" in the solid compositions comprising the block copolymer, may provide for enhanced optical clarity of these compositions as well as the other physical property benefits associated with these materials.

The crosslinking reaction in step II may be accomplished via a variety of chemical mechanisms and/or moieties. For example, crosslinking of non-linear blocks within the block copolymer may result from the condensation of residual silanol groups present in the non-linear blocks of the copolymer and/or via hydrosyliliation between, e.g., Si—H bonds and $R^4$ groups remaining unreacted on the non-linear blocks. Crosslinking of the non-linear blocks within the block copolymer may also occur between "free resin" components and the non-linear blocks via silanol condensation and/or hydrosilylation. "Free resin" components may be present in the block copolymer compositions as a result of using an excess amount of an organosiloxane resin during the preparation of the block copolymer. The free resin component may crosslink with the non-linear blocks by condensation of the residual silanol groups present on the non-blocks and on the free resin. The free resin may provide crosslinking by reacting with lower molecular weight compounds added as crosslinkers. The free resin, when present, may be present in an amount of from about 10% to about 20% by weight of the organosiloxane block copolymers of the embodiments described herein, e.g., from about 15% to about 20% by weight organosiloxane block copolymers of the embodiments described herein. The free resin may provide crosslinking by reacting with lower molecular weight compounds added as crosslinkers.

In one embodiment, the crosslinking in step II is accomplished by a second hydrosilylation reaction. In some embodiments, a crosslinker having the formula $R^{1'}_qR^3_{(3-q)}SiO(R^{1'}_2SiO_{2/2})_mSiR^3_{(3-q)}R^{1'}_q$ where each $R^{1'}$ is as defined herein; m varies from 0 to 50 (e.g., an average of from about 10 to about 50 D units; about 20 to about 50 D units; about 5 to about 40 D units; or about 10 to about 40 D units), alternatively 0 to 10, alternatively 0 to 5, alternatively m is 0; q is 0, 1, or 2, alternatively q is 2; $R^3$ is H, $R^{1'}$, or $R^4$, as each term is defined herein; is added as an additional component in step II. In some embodiments, the crosslinker may contain either Si—H units (when $R^3$=H) or contain an unsaturated group (when $R^3$=$R^4$). As such, the crosslinker may react with the linear-resin organosiloxane block copolymer formed in step I via a hydrosilylation reaction. In some embodiments, if the resin-linear organosiloxane block copolymer from step I) contains residual Si—H units, the crosslinker in step II selected may contain an $R^4$ group to enable the hydrosilylation to proceed. In other embodiments, if the resin-linear organosiloxane block copolymer from step I) contains residual unsaturated groups, the crosslinker in step II selected may contain Si—H units to enable the hydrosilylation to proceed.

When a second hydrosilylation reaction is used to effect the crosslinking in step II, in some embodiments, additional amounts of the hydrosilylation catalyst are added (in amounts as described herein) and similar reaction conditions may be used as described herein to effect the hydrosilylation in step II. In some embodiments, the second hydrosilylation is conducted in the same reaction vessel as in step I, e.g., once step I is substantially completed.

In a further embodiment, the crosslinker is tetramethyldisiloxane $H(CH_3)_2SiOSi(CH_3)_2H$, e.g., when excess unsaturated groups remain on the resin-linear organosiloxane block copolymer from step I).

In a further embodiment, the crosslinker is divinyltetramethyldisiloxane $(H_2C=CH)(CH_3)_2SiOSi(CH_3)_2(HC=CH_2)$ e.g., when excess Si—H units remain on the resin-linear organosiloxane block copolymer from step I).

B) The Capping Agent of the Formula $R'SiX_3$

Component B) is a capping agent of the formula $R^5SiX_3$, wherein $R^5$ is a $C_1$ to $C_{12}$ hydrocarbyl (e.g., a $C_1$ to $C_8$ hydrocarbyl, a $C_1$ to $C_6$ hydrocarbyl or a $C_1$ to $C_4$ hydrocarbyl), a $C_1$ to $C_{12}$ halogen-substituted hydrocarbyl (e.g., a $C_1$ to $C_8$ halogen-substituted hydrocarbyl, a $C_1$ to $C_6$ halogen-substituted hydrocarbyl or a $C_1$ to $C_4$ halogen-substituted hydrocarbyl, wherein the halogen may be a fluorine, chlorine or bromine) or a vinyl functional organosiloxane; X is a hydrolyzable group chosen from —$OR^6$, Cl, —$OC(O)R^6$, —$N(R^6)_2$, or —$ON=CR^6_2$, wherein $R^6$ is a $C_1$ to $C_8$ hydrocarbyl (e.g., a $C_1$ to $C_6$ hydrocarbyl or a $C_1$ to $C_4$ hydrocarbyl), or alternatively $R^6$ is a $C_1$ to $C_8$ alkyl group, or alternatively a phenyl group, or alternatively $R^6$ is methyl, ethyl, or a combination of methyl and ethyl (e.g., when X is —$N(R^6)_2$).

The capping agents used as component B) may be the same or similar as the crosslinking compounds described herein used in the preparation of A) the resin linear organosiloxane block copolymer; that is, the organosilanes having the formula $R^7_qSiX_{4-q}$ used to crosslink the resin linear organosiloxane block copolymer. However, it should be understood that component B) is an additional component, added for the purpose of introducing moisture curable sites onto a preformed resin-linear organosiloxane block copolymer. As such, the reaction of component B) may be considered as "post capping" the resin-linear organosiloxane block copolymer used as component A).

In one embodiment, the organosilane is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.). Other suitable, non-limiting organosilanes useful in some embodiments include; methyltris(methylethylketoxime)silane (MTO), methyl triacetoxysilane, ethyl triacetoxysilane, tetraacetoxysilane, tetraoximesilane, dimethyl diacetoxysilane, dimethyl dioximesilane, and methyl tris(methylmethylketoxime)silane.

In some embodiments, the group $R^5$ in the formula $R^5SiX_3$ is an organohydrogensiloxane. In this embodiment, the resin-linear organopolysiloxane block copolymer selected as component A) is one prepared by "hydrosilylation" methods, as described herein. Furthermore, the resin-linear organopolysiloxane block copolymer selected as component A) should contain residual unsaturated aliphatic groups (such as vinyl groups) to enable a further hydrosilylation reaction with the Si—H containing capping agent of this embodiment. The organohydrogensiloxane selected for this embodiment may have the formula:

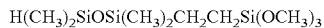

$H(CH_3)_2SiOSi(CH_3)_2CH_2CH_2Si(OCH_3)_3$ or others similar in structure, such as those containing other alkoxy groups, or those with containing additional disiloxy units.

In some embodiments, the group $R^5$ in the formula $R^5SiX_3$ is a vinyl functional organosiloxane or organosilane. In this embodiment, the resin-linear organopolysiloxane block copolymer selected as component A) is one prepared by "hydrosilylation" methods, as described herein. Furthermore, the resin-linear organopolysiloxane block copolymer selected as component A) should contain residual Si—H to enable a further hydrosilylation reaction with the vinyl groups of the capping agent of this embodiment. The vinyl functional organosilane selected for this embodiment may have the formula $H_2C=CHSi(OCH_3)_3$, or others similar in structure, such as those containing other alkoxy groups (e.g., ethoxy or propoxy).

The amounts of component A) and B) combined to form the hot melt composition may vary. In some embodiments, the amounts used will depend on the specific resin-linear organosiloxane block copolymer used as component A) and the specific capping agent selected as component B). When the resin-linear organosiloxane block copolymer is a "acetoxy" based (as described herein), a sufficient stoichiometric amount of the capping agent is added to theoretically react with the silanol content of selected resin-linear organosiloxane block copolymer. When the resin-linear organosiloxane block copolymer is a "hydrosilylation" based (as described herein), a stoichiometric amount of the capping agent is added to provide an approximate 1/1 molar ratio of SiH/vinyl groups present on either component A) and B). Alternatively, the amounts of components A) and B) used to prepare the hot melt compositions should ensure a stoichiometry that provides a resin-linear organosiloxane block copolymer that contains at least 1 weight percent alkoxy (or acetoxy) groups.

The method for combing components A) and B) is not limiting and usually does not require any special processing techniques. In some embodiments, components A) and B) are combined and mixed with simple processes such as stirring. In some embodiments, component A) remains in the solvent which was used to prepare the resin-linear organosiloxane copolymer. The mixing may be done at ambient temperatures, or alternatively at elevated temperatures ranging from 20° C. to 150° C., or alternatively at the reflux temperature of the solvent present with component A).

C) The Cure Catalyst

The present hot melt compositions (e.g., hot melt adhesive compositions) contain the reaction product of a resin linear organosiloxane block copolymer and an organosilane "capping agent" containing hydrolyzable groups. As such, these compositions may be considered as "moisture curable" since a hydrolyzable group has been introduced onto the resin linear organosiloxane block copolymer. Subsequently, these compositions cure upon exposure to moisture. The moisture cure process may be enhanced by the addition of a cure catalyst, as optional component C) in the hot melt compositions. The cure catalyst selected as component C) thus can be any cure catalyst known in the art for enhancing the moisture cure of organosiloxanes. Examples include, but are not limited to, amines and complexes of lead, tin, titanium, zinc, and iron. Other examples include, but are not limited to basic compounds, such as trimethylbenzylammonium hydroxide, tetramethylammonium hydroxide, n-hexylamine, tributylamine, diazabicycloundecene (DBU) and dicyandiamide; and metal-containing compounds such as tetraisopropyl titanate, tetrabutyl titanate (e.g., Tyzor® TnBT), titanium acetylacetonate, aluminum triisobutoxide, aluminum triisopropoxide, zirconium tetra(acetylacetonato), zirconium tetrabutylate, cobalt octylate, cobalt acetylacetonato, iron acetylacetonato, tin acetylacetonato, dibutyltin octylate, dibutyltin laurate, zinc octylate, zinc bezoate, zinc p-tert-butylbenzoate, zinc laurate, zinc stearate, aluminium phosphate, and alminium triisopropoxide; organic titanium chelates such as aluminium trisacetylacetonate, aluminium bisethylacetoacetate monoacetylacetonate, diisopropoxybis(ethylacetoacetate)titanium, and diisopropoxybis(ethylacetoacetate)titanium. In some embodiments, the cure catalysts include zinc octylate, zinc bezoate, zinc p-tert-butylbenzoate, zinc laurate, zinc stearate, aluminium phosphate, and aluminum triisopropoxide. See, e.g., U.S. Pat. No. 8,193,269, the entire disclosure of which is incorporated by reference as if fully set forth herein. Other examples of cure catalysts include, but are not limited to aluminum alkoxides, antimony alkoxides, barium alkoxides, boron alkoxides, calcium alkoxides, cerium alkoxides, erbium alkoxides, gallium alkoxides, silicon alkoxides, germanium alkoxides, hafnium alkoxides, indium alkoxides, iron alkoxides, lanthanum alkoxides, magnesium alkoxides, neodymium alkoxides, samarium alkoxides, strontium alkoxides, tantalum alkoxides, titanium alkoxides, tin alkoxides, vanadium alkoxide oxides, yttrium alkoxides, zinc alkoxides, zirconium alkoxides, titanium or zirconium compounds, especially titanium and zirconium alkoxides, and chelates and oligo- and polycondensates of the above alkoxides, dialkyltin diacetate, tin (II) octoate, dialkyltin diacylate, dialkyltin oxide and double metal alkoxides. Double metal alkoxides are alkoxides containing two different metals in a particular ratio. In some embodiments, the cure catalysts include titanium tetraethylate, titanium tetrapropylate, titanium tetraisopropylate, titanium tetrabutylate, titanium tetraisooctylate, titanium isopropylate tristearoylate, titanium truisopropylate stearoylate, titanium diisopropylate distearoylate, zirconium tetrapropylate, zirconium tetraisopropylate, zirconium tetrabutylate. See, e.g., U.S. Pat. No. 7,005,460, the entire disclosure of which is incorporated by reference as if fully set forth herein. In addition, the cure catalysts include titanates, zirconates and hafnates as described in DE 4427528 C2 and EP 0 639 622 B1, both of which are incorporated by reference as if fully set forth herein.

The amount of cure catalyst added as component C may vary and is not limiting. In some embodiments, the amount is from about 0.1 to about 5 parts by weight, alternatively about 0.1 to about 1 parts by weight of the catalyst are added per 100 parts by weight of the resin linear organosiloxane copolymer in the hot melt composition.

The hot melt compositions may contain additional components, such as additives known to increase the storage stability of hot melt or curable compositions. These additive include "moisture scavengers" such as isobutyl triethoxy silane (or other similar alkoxysilanes), available commercially as Dow Corning® Z-6403.

The hot melt compositions may be further characterized by certain physical properties such as tensile strength and % elongation at break. The hot melt compositions may have an initial tensile strength greater than 1.0 MPa, alternatively greater than 1.5 MPa, alternatively greater than 2 MPa, alternatively greater than 3 MPa, alternatively greater than 4 MPa, alternatively greater than 5 MPa or alternatively greater than 8 MPa. In some embodiments the hot melt compositions may have an initial tensile strength of from about 1 MPa to about 10 MPa, alternatively from about 3 MPa to about 10 MPa, alternatively from about 3MPa to about 6 MPa, alternatively from about 3MPa to about 9 MPa, from about 5MPa to about 9 MPa or from about 6 MPa to about 10 MPa.

The hot melt compositions may have an initial % elongation at break (or rupture) greater than 80%, alternatively greater than 200%, or alternatively greater than 300-600%. In some embodiments, the solid compositions may have a % elongation at break (or rupture) of from about 80% to about 700%, e.g., from about 80% to about 200%, from about 100% to about 650%, from about 200% to about 400%, from about 300% to about 650%, or from about 400% to about 650%. As used herein, tensile strength and % elongation at break are measured according to ASTM D412.

One advantage of the hot melt compositions described herein is that they can be processed several times, because, in some embodiments, they do not substantially cure unless they are exposed to moisture (e.g., ambient moisture). Accordingly, before the compositions are exposed to moisture (e.g., ambient moisture), and they substantially cure, they may be reprocessed multiple times. Thus, the present resin-linear organopolysiloxanes block copolymers may offer the significant advantage of being "re-processable" in conjunction with the benefits associated with silicones including hydrophobicity, high temperature stability, and moisture/UV resistance.

In one embodiment, the solid compositions of the organosiloxane block copolymers may be considered as "melt processable." In some embodiments, the solid compositions, such as a coating formed from a film of a solution containing the organosiloxane block copolymers, exhibit fluid behavior at elevated temperatures, that is upon "melting." The "melt processable" features of the solid compositions of the organosiloxane block copolymers may be monitored by measuring the "melt flow temperature" of the solid compositions, that is when the solid composition demonstrates liquid behavior. The melt flow temperature may specifically be determined by measuring the storage modulus (G'), loss modulus (G") and tan delta (tan δ) as a function of temperature storage using commercially available instruments. For example, a commercial rheometer (such as TA Instruments' ARES-RDA with 2KSTD standard flexular pivot spring transducer, with forced convection oven) may be used to measure the storage modulus (G'), loss modulus (G") and tan delta as a function of temperature. Test specimens (e.g., 8 mm wide, 1 mm thick) may be loaded in between parallel plates and measured using small strain oscillatory rheology while ramping the temperature in a range from 25° C. to 300° C. at 2° C./min (frequency 1 Hz).

The term "about," as used herein, can allow for a degree of variability in a value or range, for example, within 10%, within 5%, or within 1% of a stated value or of a stated limit of a range.

Values expressed in a range format should be interpreted in a flexible manner to include not only the numerical values explicitly recited as the limits of the range, but also to include all the individual numerical values or sub-ranges encompassed within that range as if each numerical value and sub-range were explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range.

Embodiments of the invention described and claimed herein are not to be limited in scope by the specific embodiments herein disclosed, since these embodiments are intended as illustration of several aspects of the disclosure. Any equivalent embodiments are intended to be within the scope of this disclosure. Indeed, various modifications of the embodiments in addition to those shown and described herein will become apparent to those skilled in the art from the foregoing description. Such modifications are also intended to fall within the scope of the appended claims.

The Abstract is provided to allow the reader to quickly ascertain the nature of the technical disclosure. It is submitted with the understanding that it will not be used to interpret or limit the scope or meaning of the claims.

EXAMPLES

The following examples are included to demonstrate specific embodiments of the invention. However, those of skill in the art should, in light of the present disclosure, appreciate that many changes can be made in the specific embodiments which are disclosed and still obtain a like or similar result without departing from the spirit and scope of the invention. All percentages are in wt. %. All measurements were conducted at 23° C. unless indicated otherwise.

Characterization Techniques $^{13}$C NMR Spectrometry

A small sample of system D based material was cast under nitrogen and allowed to evaporate overnight. This sample, totaling about 3 grams, was dissolved into 1 gram $CDCl_3$ and 4 grams of 0.04M $Cr(AcAc)_3$ solution in $CDCl_3$. Mixture was then transferred to a silicon-free NMR tube and spectrum was acquired using a Varian Mercury 400 MHz NMR.

Rheology analysis

A commercially available rheometer from TA Instruments (ARES-RDA with 2KSTD standard flexular pivot spring transducer, TA Instruments, New Castle, Del. 19720) with forced convection oven. Test specimens (e.g., 8 mm wide, 1 mm thick) were loaded in between parallel plates while ramping the temperature in a range from 25° C. to 250° C. at 3° C./min.

Tensile Testing

Solution was cast in a fume hood and allowed to evaporate and moisture cure for three days. Three "dog-bones" were then punched from the sheets of material and pulled on an Instron operated by Bluehill software.

Example 1

Preparation of Hot Melts Based on Acetoxy-Silane Coupled Chemistry

Synthesis was carried out in a three neck round bottom flask equipped with a stir rod and paddle, a thermometer, and a Dean Stark apparatus connected to a water cooled condenser; an oil bath was used for heating and a nitrogen blanket was applied. The Dean Stark was only utilized in acetoxysilane coupling where it was pre-filled with toluene to keep the solution volume constant as water was evolved.

The resin-linear organosiloxane copolymer was based prepared according to the methods described in as described in Published PCT Application No. WO2012/040302. Formation of a 100 g solids batch at 40 wt.% in toluene consisted of first, heating a solution of 28 g 217 flake and 100 g toluene at reflux for 30 minutes with constant stirring. In this time, a solution of 72 g 184 dp silanol terminated polydimethylsiolxane (PDMS) and 50 g toluene was capped with alkyl triacetoxy silane by adding 4.99 g of 50/50 wt. % methyltriacetoxysilane/ethyltriacetoxysilane (MTA/ETA) in toluene, under nitrogen and mixing at room temperature for 30 minutes.

In the presence of a nitrogen blanket, the reaction flask was cooled to 108° C. and then the PDMS solution was added; this was followed by heating at reflux for 2 hours. To ensure the formation of an optically clear sheet, the reaction flask was cooled to 108° C. and then 6.84 g of 50/50 wt. % MTA/ETA in toluene, was added. The reaction mixture was heated at reflux for 1 more hour. This provided a resin-linear prepolymer with the right optical clarity and mechanical properties prior to capping with moisture cureable groups.

Examples 1A, 1B, and C

Alkyl Triacetoxy Silane Post-Cap

To stoichiometrically cap the remaining silanols in a 100 g solids batch of resin linear at 40% in toluene, 24.32 g of 50/50 wt. % MTA/ETA in toluene was added and heated at reflux for 1 hour. (Example 1A) In an additional study on the effects of different amounts of MTA/ETA, small batches of resin linear solution were mixed at room temperature overnight with different amounts of 50/50 wt. % MTA/ETA in toluene, at 20 and 40 wt. % (Examples 1B, and 1C respectively) above and below the amount needed to stoichiometrically cap all remaining silanols.

Example 1D, 1E, 1F

Methoxylation

In order to create a methoxylated product, the resin-linear was first stoichiometrically capped with 50/50 wt. % MTA/ETA in toluene. Methanol was added at a 3× stoichiometric ratio based on the acetoxy groups of MTA/ETA and the solution was stirred at room temperature overnight.

A 1 L 4-neck round bottom flask was loaded with toluene (120.0 g) and 217 flake (33.6 g; Phenyl-T Resin; FW=137 g/mol Si and ~57 mol % OH; 0.2453 moles Si and 0.1398 moles SiOH). The flask was equipped with a thermometer, teflon stir paddle, glass stopper, and a Dean Stark apparatus attached to a water-cooled condenser. A nitrogen blanket was applied. An oil bath was used for heating. Dean Stark was prefilled with toluene. The reaction mixture was heated at reflux for 30 minutes. The reaction mixture was then cooled to 108° C. (pot temperature).

A solution of toluene (60.0 g) and silanol terminated PDMS (86.4 g; FW=74.3 g/mole Si and ~1.01 mol % OH; 1.1628 moles Si and 0.0117 moles SiOH) was capped with 50/50 wt. % MTA/ETA in toluene. The silanol terminated PDMS was prepared in a glove box (same day) under nitrogen by adding ETS 900/toluene (6.00 g, 0.0129 moles Si) to the silanol terminated PDMS and mixing at room temperature for 15 minutes.

The PDMS solution was added to the resin solution quickly at 108° C. Reaction mixture turned opaque, then clear in ~15 minutes. The reaction mixture was heated heated at reflux for 2 hours. It was then cooled to 108° C. and then added 50/50 wt. % MTA/ETA in toluene (8.05 g; target: 8.21 g, 0.0177 moles Si). The reaction mixture was heated at reflux for 1 hour. The reaction mixture was then cooled to 108° C. and then added 50/50 wt. % MTA/ETA in toluene (29.09 g; target: 29.18 g, 0.0628 moles Si) to theoretically cap remaining silanols. The reaction mixture was heated at reflux for 1 hour. The reaction mixture was cooled to room temperature and stirred overnight. Added methanol (26.90 g; 3× stoichiometric based on acetoxy groups on MTA/ETA). The reaction mixture was stirred overnight at room temperature.

In a glove box, the reaction solution was dispersed between five bottles (64.00 g; ~24 g solids each) and each was treated as follows:
Bottle 1: methyl trimethoxysilane (MTM) (0.48 g) at 2 wt. % (vs. solids) as a moisture scavenger.
Bottle 2: isobutyl triethoxysilane (iBTES) (0.48 g) at 2 wt. % (vs. solids) as a moisture scavenger.
Bottle 3: tetra-n-butyl tiatanate (TnBT) (0.12 g) at 0.5 wt. % (vs. solids) as a cure catalyst.
Bottle 4: No treatment.
Bottle 5: No treatment.

All bottles were equipped with magnetic stir bars, capped tightly, and stirred overnight.

All solutions were clear and colorless. The appearance of dried sheets made from the material contained in each bottle was: MTM—clear; iBTES—slightly cloudy; TnBT—clear; No treatment—clear.

Example 1F, 1G, 1H

Methyl Trimethoxy Silane Post-Cap

A 500 mL 3-neck round bottom flask was loaded with toluene (60.0 g) and 217 flake (16.8 g; Phenyl-T Resin; FW=137 g/mol Si and ~57 mol % OH; 0.2044 moles Si and 0.116 moles SiOH). The flask was equipped with a thermometer, teflon stir paddle, glass stopper, and a Dean Stark apparatus attached to a water-cooled condenser. A nitrogen blanket was applied. An oil bath was used for heating. Dean Stark was prefilled with toluene. The reaction mixture was heated at reflux for 30 minutes. The reaction mixture was then cooled to 108° C. (pot temperature).

A solution of toluene (30.0 g) and silanol terminated PDMS (43.2 g; FW=74.3 g/mole Si and ~1.01 mol % OH; 0.9690 moles Si and 0.00979 moles SiOH) was capped with 50/50 wt. % MTA/ETA in toluene. The silanol terminated PDMS was prepared in a glove box (same day) under nitrogen by adding 50/50 wt. % MTA/ETA in toluene (2.99 g, 0.0064 moles Si) to the silanol terminated PDMS and mixing at room temperature for 45 minutes.

The PDMS solution was added to the resin solution quickly at 108° C. Reaction mixture turned opaque, then clear in ~10 minutes. The reaction mixture was heated at reflux for 2 hours. It was then cooled to 108° C. and then added 50/50 wt. % MTA/ETA in toluene (4.01 g; target: 4.10 g, 0.0088 moles Si). The reaction mixture was heated at reflux for 1 hour. The reaction mixture was then cooled to 85° C. and then added 50/50 wt. % MTA/ETA in toluene (4.27 g; target: 4.28 g, 0.0314 moles Si). Removed the Dean Stark apparatus and heated at reflux (about 108° C. pot temperature) for 1 hour. The reaction mixture was cooled to room temperature and stirred overnight.

In a glove box, 90.0 g of the reaction solution was taken and equally dispensed into two bottles (about 20 g solids each). To one of these bottles was added TnBT (0.1 g; 0.5 wt. % vs. solids) was added along with a magnetic stir bar and the solution was mixed for two hours at room temperature.

To the remaining 51.2 g (about 20 g solids) of the reaction solution still in the flask was added TnBT (0.1 g; 0.5 wt. % vs. solids) was added. The vessel was heated to 95° C. and held for 2 hours. After which, it was cooled to room temperature and bottled in a glove box.

All bottles were securely capped and stored in a nitrogen-purged desiccator until use.

The addition of TnBT followed by at 2 hour reflux caused the product solution to be off-white and cloudy while the other two solutions were clear. The sheet appearance directly corresponded with the color of the solution it was cast from.

Example 2

Preparation of Hot Melts Based on hydrosilylation Chemistry

A reaction flask was loaded with 28.93 g Vinyl MTQ Resin having the average formula $M^{Vi}_{0.15}T^{Ph}_{0.76}Q_{0.082}$ at 48.4% in toluene, 36.00 g Si—H terminated PDMS, and 77.93 g toluene. With constant stirring, the mixture was heated to 100° C. before adding 0.275 g Pt(VI) solution (3887 ppm Pt in toluene); this was followed by heating at reflux for 1 hour. The solution was then cooled to 65° C. and 1.36 g tetramethyldisiloxane was added with a subsequent heating at reflux for 3 hours. After which, FTIR confirmed no Si—H remained. This provided a resin-linear pre-polymer with the right optical clarity and mechanical properties prior to capping with moisture cureable groups.

Example 2A and B

Ethylene Trimethoxy Silane Capping

To the resin linear solution was added 0.82 g of H(CH$_3$)$_2$SiOSi(CH$_3$)$_2$CH$_2$CH$_2$Si(OCH$_3$)$_3$ (ETM converter) which resulted in a 30% stoichiometric theoretical conversion of remaining vinyl groups on resin. The reaction mixture was then heated at reflux for 20 minutes. FTIR analysis revealed the reaction was complete since no SiH was left.

Example 2C, D, and E

Addition of Moisture Scavengers and Cure Catalysts

Moisture scavengers, Z-6403 (isobutyl triethoxy silane) (Example 2C) and Z-6070 (Example 2D), were stirred into different solutions at 2 wt. % vs. solids content.

Cure catalyst, Tyzor TnBT (tetra-n-butyl titanate), was stirred into different solutions at 0.5 wt. % vs. solids content. In one test with the MTM-capped acetoxy hot melt, the solution was heated to 95° C. for 2 hours after TnBT addition. (Example 2E).

Example 3

Comparative

This example was adapted from U.S. Pat. No. 3,607,972. The example below shows a moisture curable resin-linear made by coupling resin with linear and adding an excess of acetoxy-silane in solution. Since the acetoxy-silane is added during resin-linear synthesis as opposed to after forming the right architecture, an inferior cloudy material is formed (60 g solids).

A 500 mL 4-neck round bottom flask was loaded with toluene (60.0 g) and 217 flake (16.8 g; Phenyl-T Resin; FW=136.6 g/mol Si; 0.123 moles Si and 0.180 moles SiOH). The flask was equipped with a thermometer, teflon stir paddle, and a Dean Stark apparatus attached to a water-cooled condenser. A nitrogen blanket was applied. An oil bath was used for heating. Dean Stark was prefilled with toluene. The reaction mixture was heated at reflux for 30 minutes. The reaction mixture was then cooled to 108° C. (pot temperature).

A solution of toluene (30.0 g) and silanol terminated PDMS (43.2 g; FW=74.3 g/mole Si and ~1.01 mol % OH; 0.9690 moles Si and 0.00979 moles SiOH) was capped with 50/50 wt. % MTA/ETA in toluene. It was prepared in a glove box (same day) under nitrogen by adding 50/50 wt. % MTA/ETA in toluene (1.43 g, 0.00619 mols Si) to the silanol terminated PDMS and mixing at room temperature for 30 minutes.

The PDMS solution was added to the resin solution quickly at 108° C. The reaction mixture turned opaque, then turned clear in 11 minutes. The reaction mixture was heated at reflux for 3 hours. The reaction mixture was cooled to 108° C. and then added MTA/ETA (15.56 g, 0.0673 mols Si; 1 mol Si of MTA/ETA: 1 mol SiOH on resin; amount theoretically left after reaction of diacetoxy terminated PDMS with 217 Flake). The reaction mixture was heated at reflux for 1 hour. The reaction mixture was cooled to room temperature.

Cast sheets (dried overnight) were opaque films.

Hot Melt Stability at Temperature

The compositions of Examples 1 and 2 exhibited hot melt behavior, as demonstrated by their viscous flow at elevated temperatures.

Table summarizes the reduction of viscosity at temperature as well as the increase in stability for Example 1 and 2 hot melt compositions. Initial flow data was obtained from samples cast under nitrogen, while stability data was obtained by heat-sealing samples cast under nitrogen in Al/PE moisture barrier bags and placing them in a 100° C. oven overnight before testing (storage temperature was held 100° C. rather than 120° C. because of the melting point of PE).

TABLE 1

Initial viscosity at temperature and the stability of this viscosity are shown. Only primary materials and their effective modifications are presented in this table.

| | | Viscosity at 120° C. (Pa * s) | |
|---|---|---|---|
| Example | Chemistry | Before 100° C. Exposure | Before 100° C. Exposure |
| 1A | Acetoxy: Stoichiometric ETS post-cap | 23,000 | 220,000 |
| 1F | Acetoxy: MTM post-cap | 21,000 | 89,000 |
| 1D | Acetoxy: Methoxylated | 41,000 | 64,000 |
| 1E | Acetoxy: Methoxylated + MTM | 16,000 | 17,000 |
| 2A | System D: 30% ETM conversion | 9,000 | 12,000 |
| 1D | System D: ETM conversion + MTM | 8,500 | 11,000 |

Tensile Strength

The mechanical strength of resin-linear hot melts after three day moisture cures is summarized in Table. The mechanical toughness of these moisture cured resin-linears (stress peak 4-9 MPa, elongation up to 650%) is higher than the corresponding silanol-functional, heat curable resin-linear studied earlier (stress peak 2.5 MPa, elongation at 585%).

The hydrosilylation based hot melt containing MTM moisture scavenger exhibits the greatest elongation of all non-catalyzed samples. The data also show that TnBT addition improves toughness, typically increasing elongation by almost two-fold. Both moisture cured and uncured samples of the ETM converted system D hot melt were tested, showing the material's strength can be increased through moisture cure. However, even in the uncured state, very good mechanical strength is obtained.

TABLE 2

Tensile strength of hot melt materials, each of which moisture cured for three days in open air unless otherwise noted (*). For most samples three repeats were tested and the average is reported.

| Example # | Chemistry | Thickness (mm) | Stress Peak (MPa) | Standard Deviation (MPa) | Strain Peak (%) | Young's Modulus (MPa) |
|---|---|---|---|---|---|---|
| Example 1A | Acetoxy: Stoichiometric ETS | 0.61 | 5.8 | 1.20 | 378 | 1.90 |
| Example 1B | Acetoxy: +20% excess ETS | 0.42 | 9.3 | 0.00 | 304 | 2.41 |
| Example 1C | Acetoxy: +40% excess ETS | 0.45 | 8.9 | 0.43 | 243 | 2.34 |
| Example 1D | Acetoxy: Methoxylated | 0.66 | 3.9 | 0.05 | 87 | 1.81 |
| Example 1E | Acetoxy: Methoxy. + iBTES | 0.56 | 4.6 | 0.19 | 103 | 0.57 |
| Example 1F | Acetoxy: Methoxy. + MTM | 0.69 | 3.8 | 0.08 | 106 | 0.76 |
| Example 1G | Acetoxy: Methoxy. + TnBT | 0.58 | 5.3 | 0.34 | 188 | 1.50 |
| Example 1H | Acetoxy: MTM post cap | 0.67 | 4.0 | 0.055 | 131 | 0.84 |
| Example 1I | Acetoxy: MTM cap + TnBT | 0.72 | 4.8 | 0.20 | 335 | 1.38 |
| Example 1J | Acetoxy: MTM cap + TnBT w/Heat | 0.73 | 4.8 | 0.14 | 344 | 2.02 |
| Example 2A - uncured* | hydrosilylation: ETM - uncured* | 0.88 | 3.6 | 0.21 | 336 | 0.77 |
| Example 2B | hydrosilylation: ETM conversion | 0.72 | 3.9 | 0.09 | 342 | 0.90 |
| Example 2C | hydrosilylation: ETM + iBTES | 0.81 | 3.6 | 0.20 | 410 | 0.79 |
| Example 2D | hydrosilylation: ETM + MTM | 0.82 | 3.4 | 0.14 | 416 | 0.80 |
| Example 2E | hydrosilylation: ETM + iBTES w/TnBT | 0.83 | 3.8 | 0.04 | 646 | 0.94 |

What is claimed is:

1. A hot melt composition comprising the reaction product of:
   A) a resin linear organosiloxane block copolymer comprising:
   40 to 90 mole percent disiloxy units of the formula $[R^1_2SiO_{2/2}]$,
   10 to 60 mole percent trisiloxy units of the formula $[R^2SiO_{3/2}]$,
   0.5 to 35 mole percent silanol groups $[\equiv SiOH]$;
   wherein:
   each $R^1$, at each occurrence, is independently a $C_1$ to $C_{30}$ hydrocarbyl,
   each $R^2$, at each occurrence, is independently a $C_1$ to $C_{20}$ hydrocarbyl;
   wherein:
   the disiloxy units $[R^1_2SiO_{2/2}]$ are arranged in linear blocks having an average of from 10 to 400 disiloxy units $[R^1_2SiO_{2/2}]$ per linear block,
   the trisiloxy units $[R^2SiO_{3/2}]$ are arranged in non-linear blocks having a molecular weight of at least 500 g/mole, at least 30% of the non-linear blocks are crosslinked with each other,
   each linear block is linked to at least one non-linear block; and
   the organosiloxane block copolymer has a weight average molecular weight of at least 20,000 g/mole; and
   B) a capping agent of the formula $R^5SiX_3$
   wherein $R^5$ is a $C_1$ to $C_{12}$ hydrocarbyl, an organohydrogensiloxane, or a vinyl functional organosiloxane;
   X is a hydrolyzable group chosen from —$OR^6$, Cl, —$OC(O)R^6$, —$N(R^6)_2$, or —$ON=CR^6_2$,
   wherein $R^6$ is hydrogen or a $C_1$ to $C_6$ alkyl group.

2. The hot melt composition of claim 1, wherein the resin linear organopolysiloxane is prepared by:
   I) reacting
   a) a linear organosiloxane having the formula
   $R^1_q(E)_{(3-q)}SiO(R^1_2SiO_{2/2})_nSi(E)_{(3-q)}R^1_q$,
   wherein each $R^1$, at each occurrence, is independently a $C_1$ to $C_{30}$ hydrocarbyl,
   n is 10 to 400,
   q is 0, 1 or 2,
   E is a hydrolyzable group containing at least one carbon atom, and
   b) an organosiloxane resin comprising at least 60 mole % of $[R^2SiO_{3/2}]$ siloxy units in its formula, wherein each $R^2$, at each occurrence, is independently a $C_1$ to $C_{20}$ hydrocarbyl,
   in c) an organic solvent;
   to form a resin-linear organosiloxane block copolymer;
   wherein the amounts of a) and b) used in step I are selected to provide the resin-linear organosiloxane block copolymer with 40 to 90 mole % of disiloxy units $[R^1_2SiO_{2/2}]$ and 10 to 60 mole % of trisiloxy units $[R^2SiO_{3/2}]$, and
   wherein at least 95 weight percent of the linear organosiloxane used in step I is incorporated into the resin-linear organosiloxane block copolymer; and
   II) reacting the resin-linear organosiloxane block copolymer from step i) and organosilane having the formula $R^6_qSiX_{4-q}$, wherein $R^6$ is a $C_1$ to $C_8$ hydrocarbyl or a $C_1$ to $C_8$ halogen-substituted hydrocarbyl, X is a hydrolyzable group, and q is 0, 1, or 2;

to crosslink the trisiloxy units of the resin-linear organosiloxane block copolymer sufficiently to increase the weight average molecular weight ($M_w$) of the resin-linear organosiloxane block copolymer by at least 50%.

3. The hot melt composition of claim 1, wherein the organosilane is an alkyltriacetoxysilane.

4. The hot melt composition of claim 1, wherein the capping agent is an alkyltriacetoxysilane or an alkyltrialkoxysilane.

5. The hot melt composition of claim 1, wherein the resin linear organopolysiloxane is prepared by:
I) reacting
a) a linear organosiloxane having the formula $$R^{1'}_q R^3_{(3-q)} SiO(R^1_2 SiO_{2/2})_n SiR^3_{(3-q)} R^{1'}_q,$$

wherein:
each $R^{1'}$, at each occurrence, is independently a $C_1$ to $C_{30}$ hydrocarbyl free of aliphatic unsaturation,
each $R^3$, at each occurrence, is independently H, $R^{1'}$, or $R^4$, wherein each $R^4$, at each occurrence, is independently a $C_2$ to $C_{12}$ hydrocarbyl group having at least one aliphatic unsaturated bond, and
n is 10 to 400, q is 0, 1, or 2;
b) an organosiloxane resin having the average formula:

$$[R^{2'}_2 R^3 SiO_{1/2}]_a [R^{2'} R^3 SiO_{2/2}]_b [R^3 SiO_{3/2}]_c [R^{2'} SiO_{3/2}]_d [SiO_{4/2}]_e,$$

wherein:
each $R^{2'}$, at each occurrence, is independently a $C_1$ to $C_{20}$ hydrocarbyl free of aliphatic unsaturation,
each $R^3$, at each occurrence, is independently H, $R^{1'}$, or $R^4$, wherein each $R^4$, at each occurrence, is a $C_2$ to $C_{12}$ hydrocarbyl group having at least one aliphatic unsaturated bond,
the subscripts a, b, c, d, and e represent the mole fraction of each siloxy unit present in the organosiloxane resin and range as follows:
a is about 0 to about 0.7,
b is about 0 to about 0.3,
c is about 0 to about 0.8,
d is about 0 to about 0.9,
e is about 0 to about 0.7,
with the provisos that a+b+c>0, c+d+e≥0.6, and a+b+c+d+e≈1, with the proviso that at least one $R^3$ substituent is H on either of the linear organosiloxane or organosiloxane resin, and at least one $R^3$ substituent is $R^4$ on the other organosiloxane; and
c) a hydrosilylation catalyst;
in an organic solvent;
to form a resin-linear organosiloxane block copolymer;
wherein the amounts of a) and b) used in step I are selected to provide the resin-linear organosiloxane block copolymer with 40 to 90 mole % of disiloxy units $[R^{1'}_2 SiO_{2/2}]$ and 10 to 60 mole % of $[R^{2'}Si O_{3/2}]$ and/or $[SiO_{4/2}]$ siloxy units, and wherein at least 95 weight percent of the linear organosiloxane added in step I is incorporated into the resin-linear organosiloxane block copolymer;
II) reacting the resin-linear organosiloxane block copolymer from step I) to crosslink the $[R^{2'} SiO_{3/2}]$ and/or $[SiO_{4/2}]$ siloxy units of the resin-linear organosiloxane block copolymer sufficiently to increase the weight average molecular weight ($M_w$) of the resin-linear organosiloxane block copolymer by at least 50%.

6. The hot melt composition of claim 5, wherein component
a) has the average formula:

$$H(CH_3)_2 SiO[(CH_3)_2 SiO_{2/2}]_n Si(CH_3)_2 H$$

where n may vary from 10 to 400,
and component b) has the average formula $$[(H_2C=CH)(CH_3)_2 SiO_{1/2}]_a [(C_6H_5)SiO_{3/2}]_d [SiO_{4/2}]_e$$

where the subscripts a, d, and e are as defined in claim 1; or
component a) has the average formula $$(H_2C=CH)(CH_3)_2 SiO[(CH_3)_2 SiO_{2/2}]_n Si(CH_3)_2 (HC=CH_2)$$

where n may vary from 10 to 400,
and component b) has the average formula $$[H(CH_3)_2 SiO_{1/2}]_a [SiO_{4/2}]_e$$

where the subscripts a and e are as defined in claim 1.

7. The hot melt composition of claim 5, wherein the capping agent has the formula:

$$H(CH_3)_2 SiOSi(CH_3)_2 CH_2 CH_2 Si(OCH_3)_3.$$

8. The hot melt composition of claim 5, wherein a crosslinker is added in step II) and/or in step I), wherein the crosslinker has the formula:

$$R^{1'}_q R^3_{(3-q)} SiO(R^{1'}_2 SiO_{2/2})_m SiR^3_{(3-q)} R^{1'}_q$$

wherein each $R^{1'}$, at each occurrence, is independently a $C_1$ to $C_{30}$ hydrocarbyl;
m varies from 0 to 50, q is 0, 1, or 2;
each $R^3$, at each occurrence, is independently H, $R^{1'}$, or $R^4$, wherein each $R^4$, at each occurrence, is a $C_2$ to $C_{12}$ hydrocarbyl having at least one aliphatic unsaturated bond.

9. The hot melt composition of claim 8, wherein the crosslinker is tetramethyldisiloxane or divinyltetramethyldisiloxane.

10. The hot melt composition of claim 5, wherein step II) further comprises adding an organosilane having the formula $R^5_q SiX_{4-q}$, where $R^5$ is a $C_1$ to $C_8$ hydrocarbyl or a $C_1$ to $C_8$ halogen-substituted hydrocarbyl, X is a hydrolyzable group, and q is 0, 1, or 2.

11. The hot melt composition of claim 10, wherein the organosilane is an alkyltriacetoxysilane.

12. The hot melt composition of claim 11, wherein the alkyltriacetoxysilane is a mixture of two alkyltriacetoxysilanes.

13. The hot melt composition of claim 12, wherein the mixture of two alkyltriacetoxysilanes comprise methyltriacetoxysilane and/or ethyltriacetoxysilane.

14. The hot melt composition of claim 5, wherein the organosiloxane resin is chosen from:

$$[H(CH_3)_2 SiO_{1/2}]_a [(C_6H_5)SiO_{3/2}]_d;$$

$$[H(CH_3)_2 SiO_{1/2}]_a [(CH_3)_2 SiO_{2/2}]_b [(C_6H_5)SiO_{3/2}]_d;$$

$$[H(CH_3)_2 SiO_{1/2}]_a [(C_6H_5)_2 SiO_{2/2}]_b [(C_6H_5)SiO_{3/2}]_d;$$

$$[H(CH_3)_2 SiO_{1/2}]_a [(C_6H_5)(CH_3)SiO_{2/2}]_b [(C_6H_5)SiO_{3/2}]_d;$$

$$[H(CH_3)_2 SiO_{1/2}]_a [(C_6H_5)SiO_{3/2}]_d [SiO_{4/2}]_e;$$

$$[H(CH_3)_2 SiO_{1/2}]_a [(CH_3)_2 SiO_{2/2}]_b [SiO_{4/2}]_e;$$

$$[H(CH_3)_2 SiO_{1/2}]_a [SiO_{4/2}]_e;$$ and combinations thereof.

15. The hot melt composition of claim 5, wherein the organosiloxane resin is chosen from:

$[Vi(CH_3)_2SiO_{1/2}]_a[(C_6H_5)SiO_{3/2}]_d;$ $[Vi(CH_3)_2SiO_{1/2}]_a[(CH_3)_2SiO_{2/2}]_b[(C_6H_5)SiO_{3/2}]_d;$ $[Vi(CH_3)_2SiO_{1/2}]_a[(C_6H_5)_2SiO_{2/2}]_b[(C_6H_5)SiO_{3/2}]_d;$ $[Vi(CH_3)_2SiO_{1/2}]_a[(C_6H_5)(CH_3)SiO_{2/2}]_b[(C_6H_5)SiO_{3/2}]_d;$ $[Vi(CH_3)_2SiO_{1/2}]_a[(C_6H_5)SiO_{3/2}]_d[SiO_{4/2}]_e;$ $[Vi(CH_3)_2SiO_{1/2}]_a[(CH_3)_2SiO_{2/2}]_b[SiO_{4/2}]_e;$ $[Vi(CH_3)_2SiO_{1/2}]_a[SiO_{4/2}]_e;$ and combinations thereof.

16. The hot melt composition of any of the above claim 1, further comprising a cure catalyst, wherein the cure catalyst is a titanate.

17. The hot melt composition of claim 16, wherein the titanate is tetra-n-butyl titanate.

18. The cured product of the composition of claim 1.

19. An LED encapsulant comprising the cured product of claim 18.

20. The cured product of the composition of claim 1, which is produced by exposing the compositions to moisture.

* * * * *